United States Patent
Han et al.

(10) Patent No.: US 11,770,973 B2
(45) Date of Patent: Sep. 26, 2023

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventors: Sanghyun Han, Hwaseong-si (KR); Dongjun Kim, Suwon-si (KR); Minji Kim, Hwaseong-si (KR); Jongwoo Kim, Hwaseong-si (KR); Eunjae Jeong, Hwaseong-si (KR); Sohee Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 610 days.

(21) Appl. No.: 16/858,392

(22) Filed: Apr. 24, 2020

(65) Prior Publication Data

US 2020/0403164 A1 Dec. 24, 2020

(30) Foreign Application Priority Data

Jun. 19, 2019 (KR) ........................ 10-2019-0072824

(51) Int. Cl.
| | |
|---|---|
| *H01L 51/00* | (2006.01) |
| *H10K 85/60* | (2023.01) |
| *H10K 50/15* | (2023.01) |
| *H10K 50/16* | (2023.01) |

(52) U.S. Cl.
CPC ....... *H10K 85/6574* (2023.02); *H10K 85/633* (2023.02); *H10K 85/656* (2023.02); *H10K 85/6572* (2023.02); *H10K 85/6576* (2023.02); *H10K 50/15* (2023.02); *H10K 50/16* (2023.02)

(58) Field of Classification Search
CPC ............... H01L 51/0073; H01L 51/006; H01L 51/0069; H01L 51/0072; H01L 51/0074; H01L 51/5056; H01L 51/5072; H01L 51/0061; H01L 51/0071; H01L 51/5012; H01L 51/5048; C07D 403/04; H10K 85/6574; H10K 85/633; H10K 85/656; H10K 85/6572; H10K 85/6576; H10K 50/15; H10K 50/16; H10K 85/657; H10K 85/636; H10K 50/11; H10K 50/14
USPC ..................................................... 428/690
See application file for complete search history.

(56) References Cited

U.S. PATENT DOCUMENTS

| | | | |
|---|---|---|---|
| 4,720,432 A | 1/1988 | VanSlyke et al. | |
| 5,061,569 A | 10/1991 | VanSlyke et al. | |
| 6,242,115 B1 | 6/2001 | Thompson et al. | |
| 8,021,764 B2 | 9/2011 | Hwang et al. | |
| 9,012,599 B2 | 4/2015 | Stoessel et al. | |
| 9,478,753 B2 | 10/2016 | Jung et al. | |
| 2014/0070199 A1 | 3/2014 | Jung et al. | |
| 2016/0099416 A1* | 4/2016 | Itoi | H01L 51/0071 544/75 |
| 2018/0148462 A1 | 5/2018 | Fuchikawa | |

FOREIGN PATENT DOCUMENTS

| | | | | |
|---|---|---|---|---|
| JP | 11-144873 A | 5/1999 | | |
| JP | 2003-133075 A | 5/2003 | | |
| JP | 2004-79265 A | 3/2004 | | |
| JP | 2006-151979 A | 6/2006 | | |
| JP | 4573923 B2 | 11/2010 | | |
| KR | 10-1453768 B1 | 10/2014 | | |
| KR | 10-1546215 B1 | 8/2015 | | |
| KR | 10-1627695 B1 | 6/2016 | | |
| KR | 10-1667449 B1 | 10/2016 | | |
| KR | 10-1781235 B1 | 9/2017 | | |
| KR | 10-2018-0062561 A | 6/2018 | | |
| WO | WO-2011107186 A2 * | 9/2011 | ........... | C07D 401/04 |
| WO | WO-2018155275 A1 * | 8/2018 | ........... | C07D 498/04 |

OTHER PUBLICATIONS

CAS reg. No. 2566625-16-7, Dec. 29, 2020. (Year: 2020).*

* cited by examiner

*Primary Examiner* — Douglas J McGinty
(74) *Attorney, Agent, or Firm* — Lewis Roca Rothgerber Christie LLP

(57) ABSTRACT

An organic electroluminescence device of an embodiment includes a first electrode and a second electrode which are faced to each other, and a plurality of organic layers between the first electrode and the second electrode, and at least one organic layer selected from among the organic layers includes an amine compound represented by Formula 1 below, and thus, the organic electroluminescence device can exhibit improved emitting efficiency and long device lifespan.

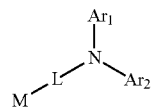

Formula 1

18 Claims, 2 Drawing Sheets

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

This application claims priority to and the benefit of Korean Patent Application No. 10-2019-0072824, filed on Jun. 19, 2019, the entire contents of which are incorporated herein by reference.

BACKGROUND

Embodiments of the present disclosure relate to an organic electroluminescence device and an amine compound used for the same, and more particularly, to an amine compound used as a hole transport material and an organic electroluminescence device including the same.

Recently, the development of an organic electroluminescence display as an image display is being actively conducted. The organic electroluminescence display is referred to as a self-luminescent display which is different from a liquid crystal display. In the organic electroluminescence display, holes and electrons injected from a first electrode and a second electrode recombine in an emission layer, and thus, a light emission material including an organic compound in the emission layer emits light to display an image.

In the application of an organic electroluminescence device to a display, the decrease of the driving voltage, and the increase of the emission efficiency and the life of the organic electroluminescence device are beneficial, and development on materials for an organic electroluminescence device which is capable of stably attaining these features is being continuously researched.

In addition, development on a hole transport layer material is in progress in order to realize a highly efficient organic electroluminescence device.

SUMMARY

Embodiments of the present disclosure provide an organic electroluminescence device in which light emitting efficiency and device lifespan are improved.

Embodiments of the present disclosure also provide an amine compound which can improve light emitting efficiency and device lifespan of an organic electroluminescence device.

An embodiment of the present disclosure provides an organic electroluminescence device including a first electrode, a second electrode facing the first electrode, and a plurality of organic layers on the first electrode and the second electrode. At least one of the organic layers includes an amine compound, the amine compound includes an amine group, and a five-ring condensed hetero compound as a substituent of the amine group, and the five-ring condensed hetero compound includes one nitrogen atom and two oxygen atoms.

In an embodiment, the hetero compound may be combined with an amine group via a linker or a direct linkage.

In an embodiment, the organic layers may include a hole transport region on the first electrode, an emission layer on the hole transport region, and an electron transport region on the emission layer. The hole transport region may include the amine compound.

In an embodiment, the hole transport region may include a hole injection layer on the first electrode, and a hole transport layer on the hole injection layer. The hole transport layer may include the amine compound.

In an embodiment, the hole transport region may include a plurality of organic layers, and the organic layers of the plurality of organic layers which are adjacent to the emission layer may include the amine compound.

In an embodiment, the amine compound may be represented by Formula 1 below:

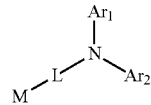

Formula 1

In Formula 1 above, L is direct linkages, substituted or unsubstituted arylene groups of 6 to 30 carbon atoms for forming a ring, or substituted or unsubstituted heteroarylene groups of 2 to 30 carbon atoms for forming a ring, $Ar_1$ and $Ar_2$ are each independently a substituted or unsubstituted aryl group having 6 to 30 carbon atoms for forming a ring, or a substituted or unsubstituted heteroaryl group having 2 to 30 carbon atoms for forming a ring, and M is represented by Formula 2 below:

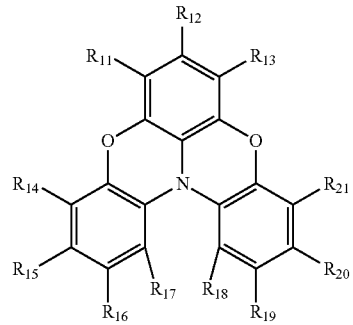

[Formula 2]

In Formula 2 above, $R_{11}$ to $R_{21}$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, and one selected from among $R_{11}$ to $R_{21}$ is a part linked to L of Formula 1.

The amine compound represented by Formula 1 may represented by Formula 3-1 or Formula 3-2 below.

[Formula 3-1]

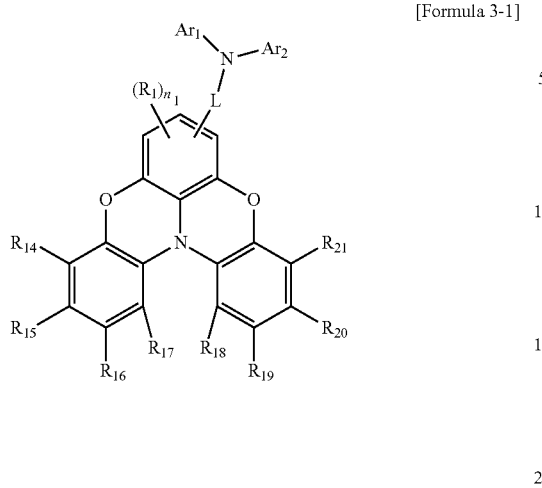

Formula 3-2

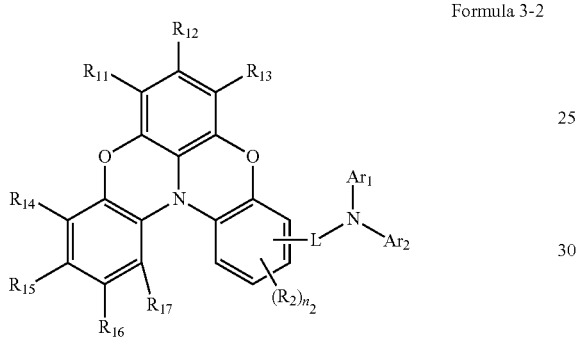

In Formula 3-1 and Formula 3-2 above, $R_1$ and $R_2$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, $n_1$ is an integer of 0 to 2, $n_2$ is an integer of 0 to 3.

In Formula 3-1 and Formula 3-2 above, $R_{11}$ to $R_{21}$, $Ar_1$, $Ar_2$, and L are the same as defined with respect to Formula 1 and Formula 2.

The amine compound represented by Formula 1 may represented by any one selected from among Formula 4-1 to Formula 4-6 below.

Formula 4-1

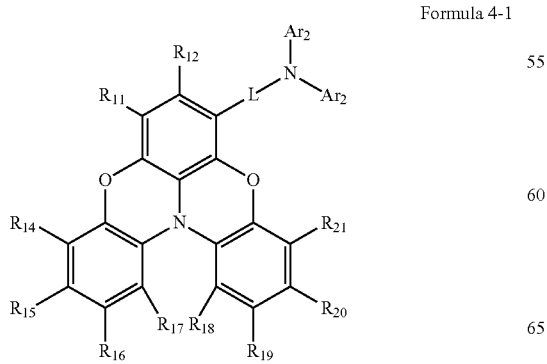

Formula 4-2

Formula 4-3

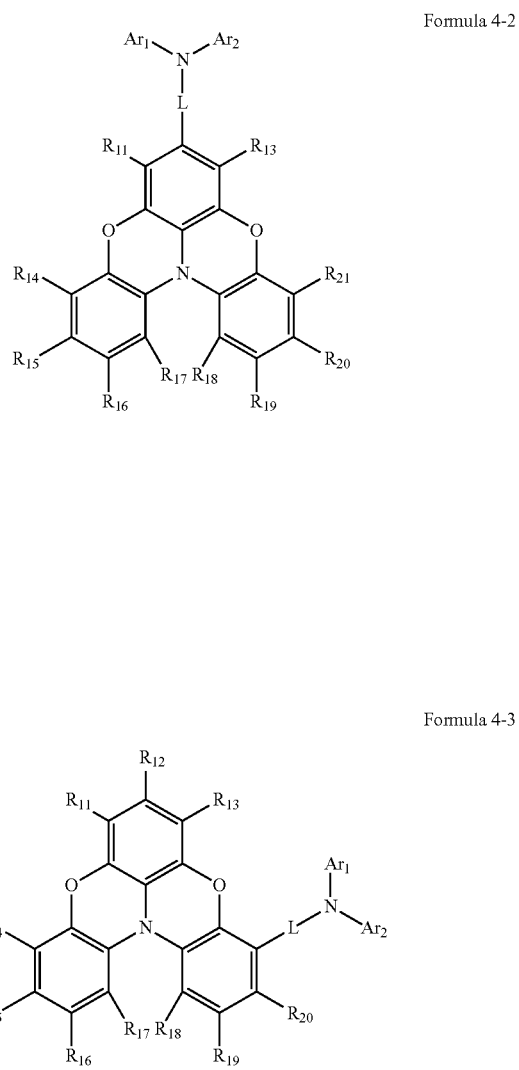

Formula 4-4

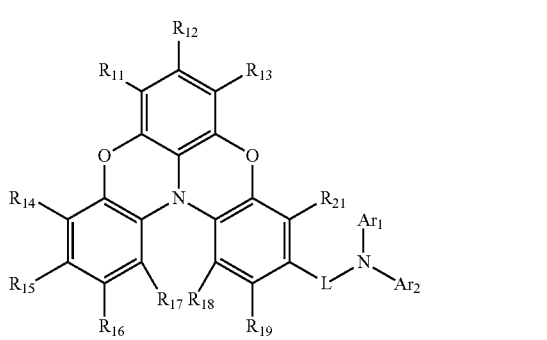

-continued

Formula 4-5

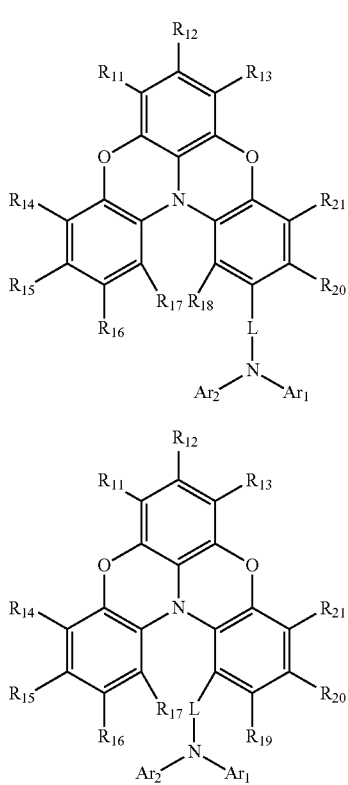

Formula 4-6

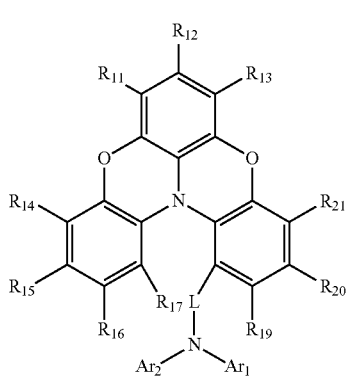

In Formula 4-1 and Formula 4-6 above, $R_{11}$ to $R_{21}$, $Ar_1$, $Ar_2$, and L are the same as defined with respect to Formula 1 and Formula 2.

The amine compound represented by Formula 1 may represented by any one selected from among Formula 5-1 to Formula 5-3 below.

Formula 5-1

Formula 5-2

Formula 5-3

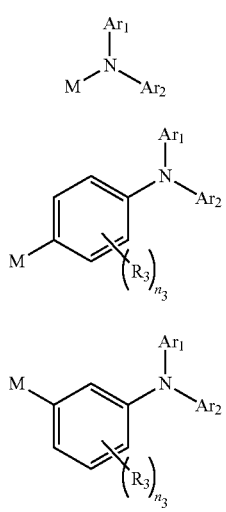

In Formula 5-1 to Formula 5-3 above, $R_3$ is a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, $n_3$ is an integer of 0 to 4.

In Formula 5-1 and Formula 5-3 above, $Ar_1$, $Ar_2$, and M are the same as defined with respect to Formula 1.

$Ar_1$ and $Ar_2$ may be each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, a substituted or unsubstituted dibenzofuran group, or a substituted or unsubstituted dibenzothiophene group.

$Ar_1$ and $Ar_2$ may be different from each other.

An embodiment of the present disclosure provides an amine compound represented by Formula 1.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
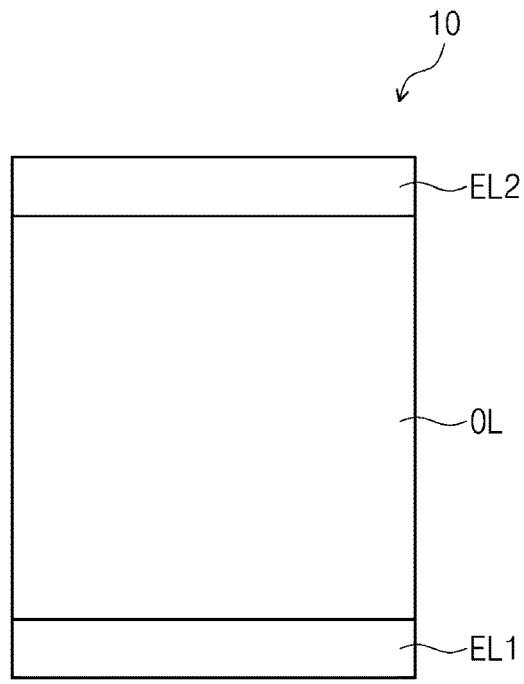
FIG. 1 is a cross-sectional view schematically illustrating an organic electroluminescence device according to an embodiment of the inventive concept.

The above objects, other objects, and features of embodiments of the present disclosure will be easily understood from exemplary embodiments with reference to the accompanying drawings. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

When explaining each of drawings, like reference numerals are used for referring to similar elements. In the accompanying drawings, the dimensions of each structure may be exaggeratingly illustrated for clarity of the present disclosure. Although the terms such as first and second are used herein to describe various components, these components should not be limited by these terms. These terms are only used to distinguish one component from other components. For example, a first component may be referred to as a second component, and similarly a second component may be referred to as a first component without departing from the scope of the present disclosure. The expression of a singular form may include plural forms unless definitely indicating a particular case in terms of the context.

In the present disclosure, it will be understood that the meaning of "comprise" or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combination thereof. It will be further understood that when a layer, a film, a region, or a plate is referred to as being 'on' another layer, film, region, or plate, it can be directly on the layer, film, region, or plate, or intervening layers, films, regions, or plates may also be present. Additionally, it will be understood that when a layer, a film, a region, or a plate is referred to as being "under" another layer, film, region, or plate, it can be "directly under" the layer, film, region, or plate, or intervening layers, films, regions, or plates may also be present.

Hereinafter, an organic electroluminescence device according to an embodiment of the present disclosure and an amine compound included in the same according to an embodiment will be explained referring to drawings.

Figure 2:
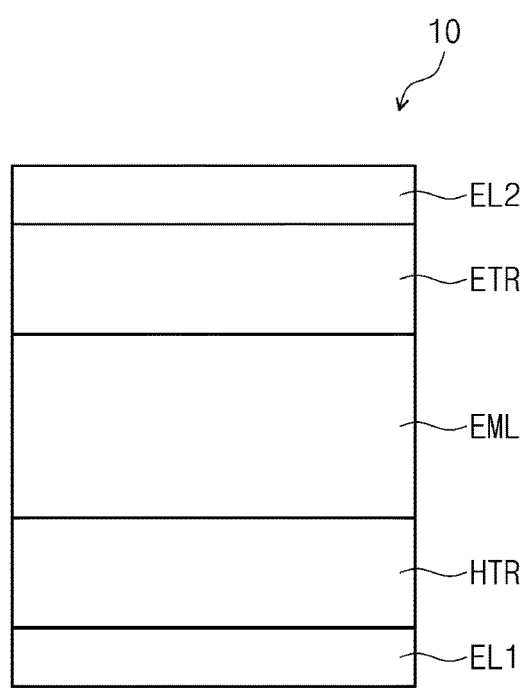
FIG. 2 is a cross-sectional view schematically illustrating an organic electroluminescence device according to an embodiment of the inventive concept.
Figure 3:
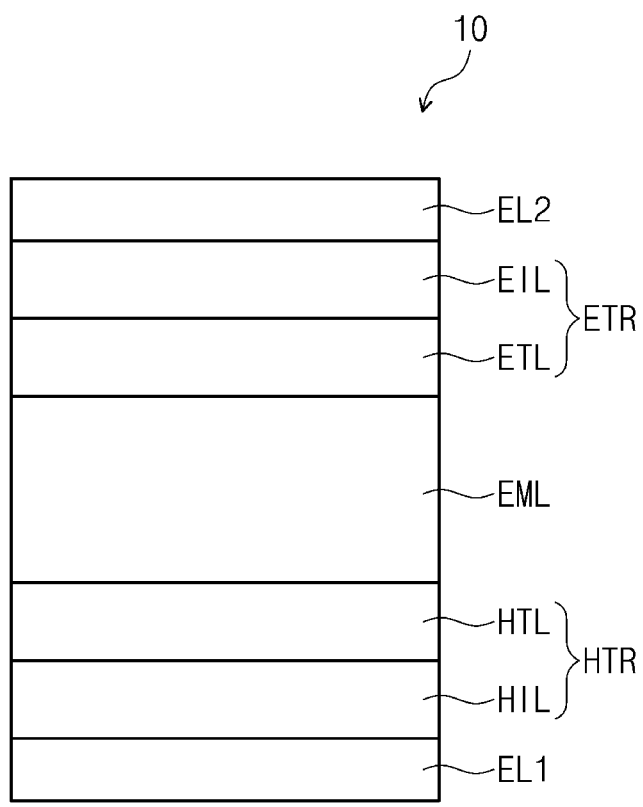
FIG. 3 is a cross-sectional view schematically illustrating an organic electroluminescence device according to an embodiment of the inventive concept.

FIGS. 1 to 3 are a cross-sectional view schematically illustrating an organic electroluminescence device according to an embodiment of the present disclosure. Referring to FIGS. 1 to 3, in an organic electroluminescence device 10 according to an embodiment of the present disclosure, a first electrode EL1 and a second electrode EL2 face each other, and a plurality of organic layers OL may be between the first electrode EL1 and the second electrode EL2. Referring to FIG. 2, the plurality of organic layers OL may include a hole transport region HTR, an emission layer EML, and an electron transport region ETR. For example, the organic electroluminescence device 10 according to an embodiment of the present disclosure may include a first electrode EL1, a hole transfer region HTR, an emission layer EML, an electron transfer region ETR, and a second electrode EL2 which are laminated sequentially.

The organic electroluminescence device 10 of an embodiment may include an amine compound according to an embodiment described herein below in at least one organic layer selected from among the plurality of organic layers OL between the first electrode EL1 and the second electrode EL2. For example, the organic electroluminescence device 10 of an embodiment may include an amine compound according to an embodiment described herein below in the hole transfer region HTR between the first electrode EL1 and the second electrode EL2. However, embodiments are not limited thereto, and the organic electroluminescence device 10 of an embodiment may include an amine compound according to an embodiment described herein below in at least one organic layer which is included in the emission layer EML and the electron transfer region ETR which are the plurality of organic layers between the first electrode EL1 and the second electrode EL2, other than the hole transport region HTR. For example, the organic electroluminescence device 10 of an embodiment may include the amine compound in the emission layer EML and the electron transfer region ETR, other than the hole transport region HTR.

When compared with FIG. 2, FIG. 3 shows the cross-sectional view of an organic electroluminescence device 10 of an embodiment, wherein the hole transfer region HTR includes a hole injection layer HIL and a hole transport layer HTL, and the electron transfer region ETR includes an electron injection layer EIL and an electron transport layer ETL. The organic electroluminescence device 10 of an embodiment may include an amine compound of an embodiment described herein below in the hole transport layer HTL. The organic electroluminescence device 10 of an embodiment may include an amine compound of an embodiment described herein below in the emission layer EML selected from among the plurality of organic layers included in the hole transport region HTR (or selected from among the plurality of organic layers OL).

Hereinafter, in the description of the organic electroluminescence device 10 of an embodiment, it is described that the organic electroluminescence device 10 includes an amine compound according to an embodiment described herein below in the hole transport region HTR, but embodiments are not limited thereto, and an amine compound according to an embodiment described herein below may be included in the emission layer EML, and/or the electron transport region ETR.

The first electrode EL1 may have conductivity (e.g., electrical conductivity). The first electrode EL1 may be formed of a metal alloy or a conductive compound. The first electrode EL1 may be an anode. In addition, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide, for example, indium tin oxide (ITO), indium zinc oxide (IZO), zinc oxide (ZnO), or indium tin zinc oxide (ITZO). When the first electrode EL1 is the transflective electrode or the reflective electrode, the first electrode EL1 may include Ag, Mg Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In some embodiments, the first electrode EL1 may have a multi-layered structure including a reflective layer or transflective layer and a transparent conductive layer formed of indium tin oxide (ITO), indium zinc oxide (IZO), zinc oxide (ZnO), or indium tin zinc oxide (ITZO). For example, the first electrode EL1 may have, but is not limited to, a three-layer structure of ITO/Ag/ITO. The first electrode EL1 may have a thickness from about 1,000 Å to about 10,000 Å, for example, from about 1,000 Å to about 3,000 Å.

The hole transport region HTR is on the first electrode EL1. The hole transport region HTR may include at least one of a hole injection layer HIL, a hole transport layer HTL, a hole buffer layer, or an electron blocking layer. The hole transport region HTR may have a thickness, for example, from about 50 Å to about 1,500 Å.

The hole transport region HTR may have a multilayer structure having a single layer formed of a single material, a single layer formed of materials different from each other, or a plurality of layers formed of materials different from each other.

For example, the hole transport region HTR may have a single layer structure of a hole injection layer HIL or a hole transport layer HTL, or a single layer structure formed of hole injection materials or hole transport materials. In addition, the hole transport region HTR has a single layer structure formed of materials different from each other, or a structure of a hole injection layer HIL/a hole transport layer HTL, a hole injection layer HIL/a hole transport layer HTL/a hole buffer layer, a hole injection layer HIL/a hole buffer layer, a hole transport layer HTL/a hole buffer layer, or a hole injection layer HIL/a hole transport layer HTL/an electron blocking layer which are sequentially laminated from the first electrode EL1, but embodiments are not limited thereto.

The hole transport region HTR may be formed by using various suitable methods such as a vacuum deposition method, a spin coating method, a casting method, a Langmuir-Blodgett (LB) method, an inject printing method, a laser printing method, and a laser induced thermal imaging (LITI) method.

The hole transport region HTR in the organic electroluminescence device 10 of an embodiment may include an amine compound of an embodiment.

In the present description, the term "substituted or unsubstituted" may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may be substituted or unsubstituted. For example, a biphenyl group may be interpreted as an aryl group or a phenyl group substituted with a phenyl group.

In the present description, the expression "being bonded to an adjacent group to form a ring" may mean being bonded to an adjacent group to form a substituted or unsubstituted hydrocarbon ring, or a substituted or unsubstituted heterocyclic ring. The hydrocarbon ring includes an aliphatic hydrocarbon ring and an aromatic hydrocarbon ring. The heterocyclic ring includes an aliphatic heterocyclic ring and an aromatic heterocyclic ring. The ring formed by being bonded to an adjacent group may be a monocyclic ring or a polycyclic ring. In addition, the ring formed by being bonded to an adjacent group may be linked to another ring to form a spiro structure.

In the present description, the term "adjacent group" may mean a substituent which is substituted for an atom directly linked to an atom for which the substituent is substituted, another substituent which is substituted for an atom for which the substituent is substituted, or a substituent sterically closest to the substituent. For example, two methyl groups in 1,2-dimethylbenzene may be interpreted as "adjacent groups" to each other, and two ethyl groups in 1,1-diethylcyclopentane may be interpreted as "adjacent groups" to each other.

In the present description, a direct linkage may be a single bond (e.g., a single covalent bond).

In the present description, examples of the halogen atom may include a fluorine atom, a chlorine atom, a bromine atom, and an iodine atom.

In the present description, the alkyl group may be a linear, branched or cyclic type. The number of carbons in the alkyl group is 1 to 50, 1 to 30, 1 to 20, 1 to 10, or 1 to 6. Examples of the alkyl group may include, but are not limited to, methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the present description, the hydrocarbon ring includes an aliphatic hydrocarbon ring and an aromatic hydrocarbon ring. The heterocyclic ring includes an aliphatic heterocyclic ring and an aromatic heterocyclic ring. The hydrocarbon ring and the heterocyclic ring may be monocyclic or polycyclic.

In the present description, the hydrocarbon ring group may be an optional functional group or substituent derived from an aliphatic hydrocarbon ring, or any functional group or substituent derived from an aromatic hydrocarbon ring. The number of carbons for forming a ring in the hydrocarbon ring group may be 5 to 60.

In the present description, the heterocyclic ring group may be an optional functional group or substituent derived from a heterocyclic ring including at least one heteroatom as an atom for forming a ring. The number of carbons for forming a ring in the heterocyclic ring group may be 5 to 60.

In the present description, the aryl group refers to an optional functional group or substituent derived from an aromatic hydrocarbon ring. The aryl group may be a monocyclic aryl group or a polycyclic aryl group. The number of carbons for forming a ring in the aryl group may be 6 to 30, 6 to 20, or 6 to 15. Examples of the aryl group may include, but are not limited to, phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the present description, the fluorenyl group may be substituted, and two substituents may be combined with each other to form a spiro structure. Examples of the substituted fluorenyl group are as follows. However, an embodiment of the present disclosure is not limited thereto.

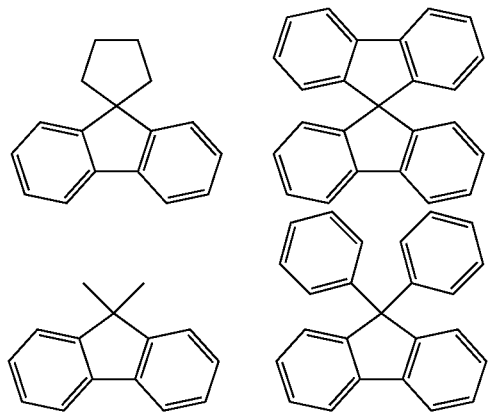

In the present description, the heteroaryl group may include one or more selected from among B, O, N, P, Si, and S as a heteroatom. In the case where the heteroaryl group includes two or more heteroatoms, two or more heteroatoms may be the same as or different from each other. The heteroaryl group may be a monocyclic heterocyclic group or a polycyclic heterocyclic group. The number of carbons for forming a ring of the heteroaryl group may be 2 to 30, 2 to 20, or 2 to 10. Examples of the heteroaryl group may include, but are not limited to, thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuranyl, etc.

In the present description, the silyl group includes an alkyl silyl group and an aryl silyl group. Examples of the silyl group may include, but are not limited to, trimethylsilyl, triethylsilyl, t-butyldimethylsilyl, vinyldimethylsilyl, propyldimethylsilyl, triphenylsilyl, diphenylsilyl, phenylsilyl, etc.

In the present description, the boron group includes an alkyl boron group and an aryl boron group. Examples of the boron group may include, but are not limited to, trimethylboron, triethylboron, t-butyldimethylboron, triphenylboron, diphenylboron, phenylboron, etc.

In the present description, the number of carbons in the amine group may be 1 to 30, but is not particularly limited thereto. The amine group may include an alkyl amine group and an aryl amine group. Examples of the amine group may include, but are not limited to, methylamine, dimethylamine, phenylamine, diphenyl amine, naphthyl amine, 9-methylanthracenyl amine, triphenyl amine, etc.

In the present description, the hydrocarbon ring group refers to an optional functional group or substituent derived from an aliphatic hydrocarbon ring. The hydrocarbon ring group may be a saturated hydrocarbon ring group having 5 to 20 carbons for forming a ring.

In the present description, the heterocyclic group may include one or more selected from among B, O, N, P, Si, and S as a heteroatom. In the case where the heterocyclic group includes two or more heteroatoms, two or more heteroatoms may be the same as or different from each other. The heterocyclic group may be a monocyclic heterocyclic group or a polycyclic heterocyclic group, and include a heteroaryl group. The number of carbons for forming a ring of the heterocyclic group may be 2 to 30, 2 to 20, or 2 to 10.

The amine compound of an embodiment includes a five-ring condensed hetero compound (e.g., a condensed hetero compound including five rings) as a substituent. The amine compound of an embodiment includes an amine group, and a five-ring condensed hetero compound (e.g., a condensed hetero compound including five rings) which is substituted in the amine group. The five-ring condensed hetero compound (e.g., the condensed hetero compound including five rings) includes one nitrogen atom and two oxygen atoms. The five-ring condensed hetero compound may be a compound in which three aryl rings link one another via one nitrogen atom and two oxygen atoms, and thus, forms five rings. In this case, the nitrogen atom may be located as a central atom of the five rings. The amine compound of an embodiment may be a monoamine compound.

The amine compound in an embodiment may be represented by Formula 1 below:

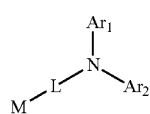

Formula 1

In Formula 1, L is a direct linkage (e.g., a single covalent bond), a substituted or unsubstituted arylene group having 6 to 30 carbon atoms for forming a ring, or a substituted or unsubstituted heteroarylene group having 2 to 30 carbon atoms for forming a ring. In an embodiment, L may be a direct linkage (e.g., a single covalent bond), or a substituted or unsubstituted phenylene group. For example, L may be a direct linkage (e.g., a single covalent bond), or an unsubstituted phenylene group.

In Formula 1, $Ar_1$ and $Ar_2$ are each independently a substituted or unsubstituted aryl group having 6 to 30 carbon atoms for forming a ring, or a substituted or unsubstituted heteroaryl group having 2 to 30 carbon atoms for forming a ring. In an embodiment, $Ar_1$ and $Ar_2$ may be each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, a substituted or unsubstituted dibenzofuranyl group, or a substituted or unsubstituted dibenzothiophene group. $Ar_1$ and $Ar_2$ may be different from each other. For example, $Ar_1$ may be a substituted or unsubstituted dibenzofuranyl group, and $Ar_2$ may be a substituted or unsubstituted fluorenyl group. In some embodiments, $Ar_1$ may be a substituted or unsubstituted carbazole group, and $Ar_2$ may be a substituted or unsubstituted phenyl group, or naphthyl group.

In Formula 1, M is represented by Formula 2 below:

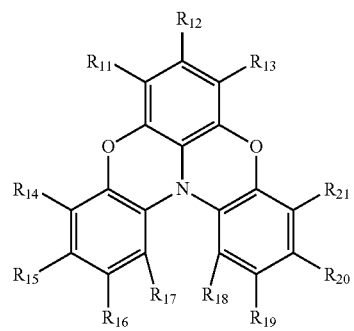

Formula 2

In Formula 2, $R_{11}$ to $R_{21}$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring. However, one selected from among $R_{11}$ to $R_{21}$ is a linking part. For example, one selected from among $R_{11}$ to $R_{21}$ is a part linked to L of Formula 1 (or N of Formula 1). In an embodiment, one selected from among $R_{11}$ to $R_{21}$ is a part linked to L (or N of Formula 1), and all of the rest may be hydrogen atoms (e.g., the remaining ones of $R_{11}$ to $R_{21}$ that are not directly linked to L or N of Formula 1 are hydrogen atoms).

The amine compound of an embodiment includes a five-ring condensed hetero compound (e.g., a condensed hetero compound including five rings) as a substituent linked to an amine, and the five-ring condensed hetero compound includes one nitrogen atom and two oxygen atoms. For example, the five-ring condensed hetero compound may be the compound in which three aryl rings link one another via one nitrogen atom and two oxygen atoms, and thus, form five rings, and a nitrogen atom may be located in the center of the five rings. The amine compound of an embodiment includes a five-ring condensed hetero compound as a substituent, and thereby the flatness of the core of the five-ring condensed hetero compound is increased. For example, an embodiment of the amine compound includes a condensed hetero compound having five rings that are substantially in a single plane (e.g., respective centers of the five rings are all substantially in the same plane), and thus, the core of the amine compound (e.g., the hetero compound including five rings) is substantially flat. While the present disclosure is not limited by any particular mechanism or theory, it is believed that the flatness of the hetero compound including the five rings improves the hole transport abilities and stability of the amine compound. Thus, the ability of a hole transport between molecules may be improved by using the amine compound of embodiments of the present disclosure. Therefore, the organic electroluminescence device including an amine compound of an embodiment as a hole transport material can have a long lifespan, in addition high emitting efficiency, low drive voltage, and high brightness because the damage of materials caused by extra charges is protected (or reduced).

The amine compound represented by Formula 1 may be represented by Formula 3-1 or Formula 3-2 below.

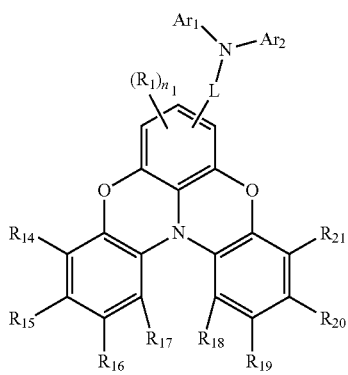

Formula 3-1

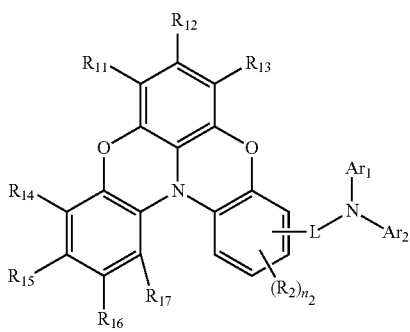

Formula 3-2

In Formula 3-1 and Formula 3-2, $R_1$ and $R_2$ may be each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring. In an embodiment, both of $R_1$ and $R_2$ may be hydrogen atoms.

In Formula 3-1, $n_1$ may be an integer of 0 to 2. In Formula 3-1, if $n_1$ is 0, the amine compound of an embodiment may not be substituted for $R_1$. In Formula 3-1, the case where $n_1$ is 2 and all the $R_1$ groups are hydrogen atoms may be the same as the case where $n_1$ is 0 in Formula 3-1. In Formula 3-1, if $n_1$ is 2, a plurality of $R_1$ groups are the same as each other or different from each other.

In Formula 3-2, $n_2$ may be an integer of 0 to 3. In Formula 3-2, if $n_2$ is 0, the amine compound of an embodiment may not be substituted for $R_2$. In Formula 3-2, the case where $n_2$ is 3 and all R2s are hydrogen atoms may be the same as the case where $n_2$ is 0 in Formula 3-2. In Formula 3-2, if $n_2$ is an integer of 2 or more, a plurality of $R_2$ groups may be all the same or at least one of the plurality of $R_2$ groups may be different from the others.

In some embodiments, $R_{11}$ to $R_{21}$, $Ar_1$, $Ar_2$, and L in Formula 3-1 and Formula 3-2 may be the same as those described with respect to Formula 1 and Formula 2.

The amine compound represented by Formula 1 may represented by any one of Formula 4-1 to Formula 4-6 below:

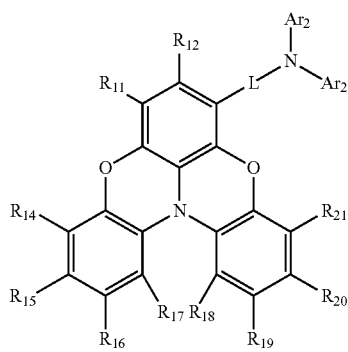

Formula 4-1

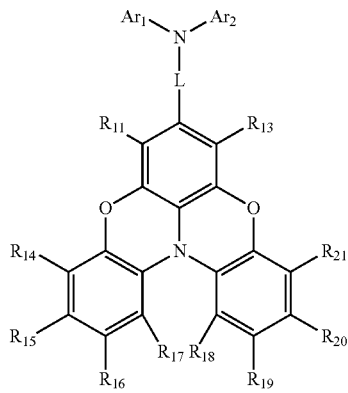

Formula 4-2

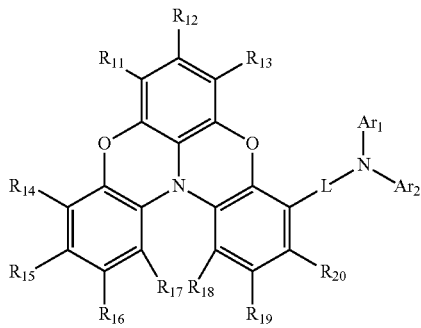

Formula 4-3

Formula 4-4

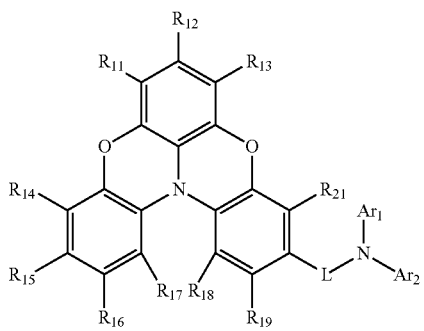

Formula 4-5

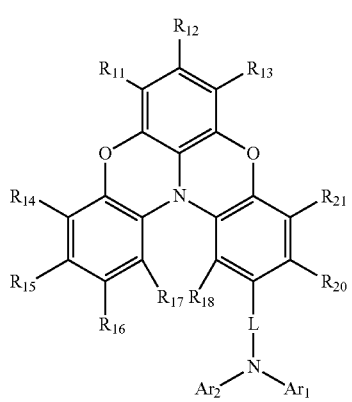

Formula 4-6

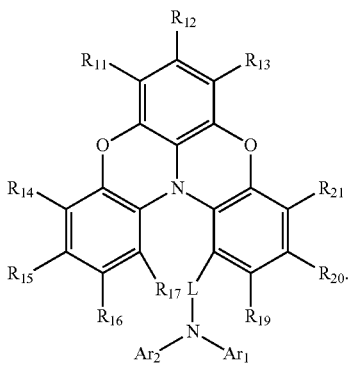

Formula 4-1 corresponds to the case where $R_{13}$ is a part linked to L in Formula 1 and Formula 2. Formula 4-2 corresponds to the case where $R_{12}$ is a part linked to L in Formula 1 and Formula 2. Formula 4-3 corresponds to the case where $R_{21}$ is a part linked to L in Formula 1 and Formula 2. Formula 4-4 corresponds to the case where $R_{20}$ is a part linked to L in Formula 1 and Formula 2. Formula 4-5 corresponds to the case where $R_{19}$ is a part linked to L in Formula 1 and Formula 2. Formula 4-6 corresponds to the case where $R_{18}$ is a part linked to L in Formula 1 and Formula 2.

$R_{11}$ to $R_{21}$, $Ar_1$, $Ar_2$, and L in Formula 4-1 to Formula 4-6 may be the same as those described with respect to Formula 1 and Formula 2.

The amine compound represented by Formula 1 may represented by any one selected from among Formula 5-1 to Formula 5-3 below:

Formula 5-1

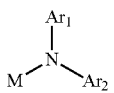

Formula 5-2

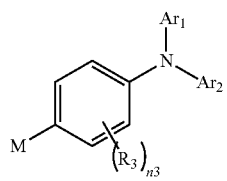

Formula 5-3

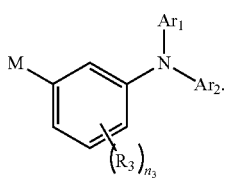

In Formula 5-1 to Formula 5-3, $R_3$ may be a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring. In an embodiment, $R_3$ may be a hydrogen atom.

In Formula 5-1 to Formula 5-3, $n_3$ may be an integer of 0 to 4. In Formula 5-1 to Formula 5-3, if $n_3$ is 0, the amine compound of an embodiment may not be substituted for $R_3$. In Formula 5-1 to Formula 5-3, the case where $n_3$ is 4 and all $R_3$ groups are hydrogen atoms may be the same as the case where $n_3$ is 0 in Formula 5-1 to Formula 5-3. In Formula 5-1 to Formula 5-3, if $n_1$ is an integer of 2 or more, a plurality of $R_3$ groups may be all the same or at least one of the plurality of $R_3$ groups may be different from the others.

In Formula 5-1 and Formula 5-3, $Ar_1$, $Ar_2$, and M may be the same described with respect to Formula 1.

The amine compound may be any one selected from among the compounds represented in Compound Group 1 below. The organic electroluminescence device 10 of an embodiment may include at least one amine compound selected from among the compounds represented by Compound Group 1 below in the hole transport region (HTR). The organic electroluminescence device 10 of an embodiment may include, in the hole transport layer (HTL), at least one amine compound selected from among the compounds represented in Compound Group 1 below.

Compound Group 1
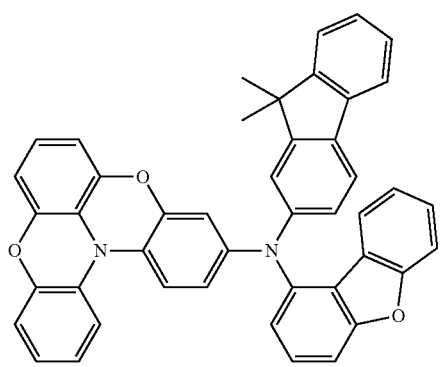
1
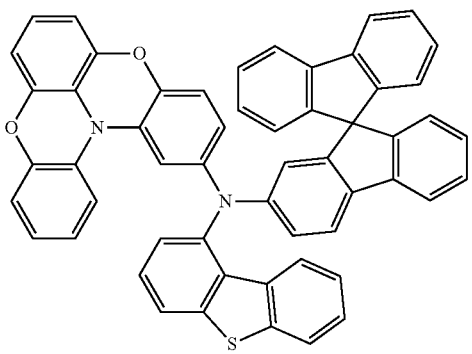
4
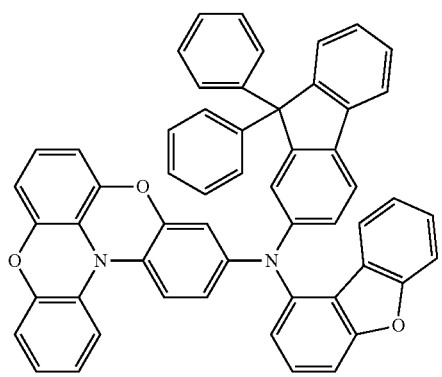
2
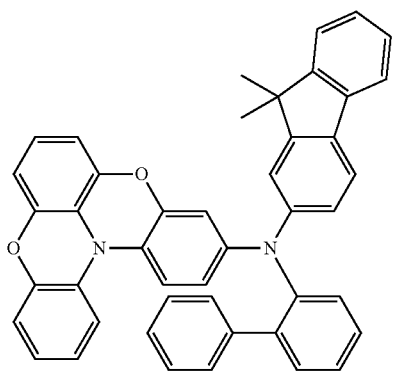
5
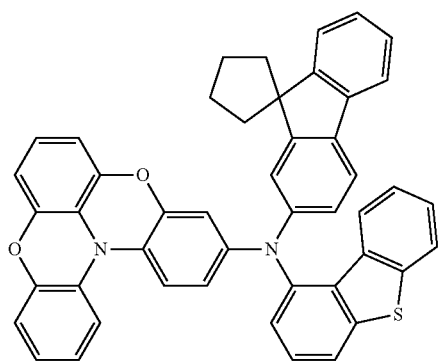
3
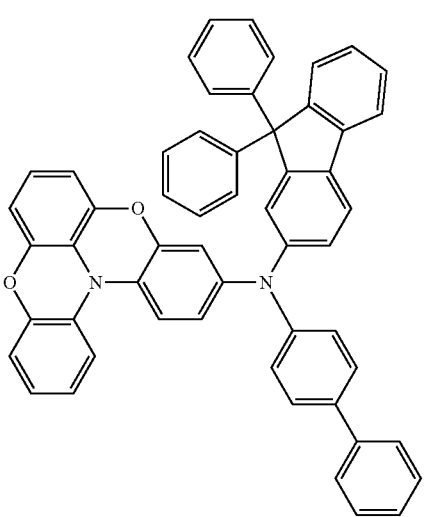
6

7
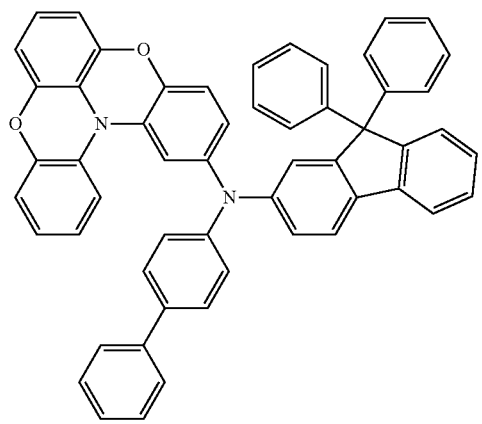
8
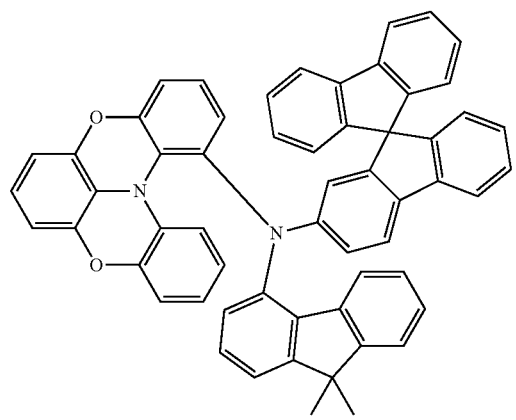
9
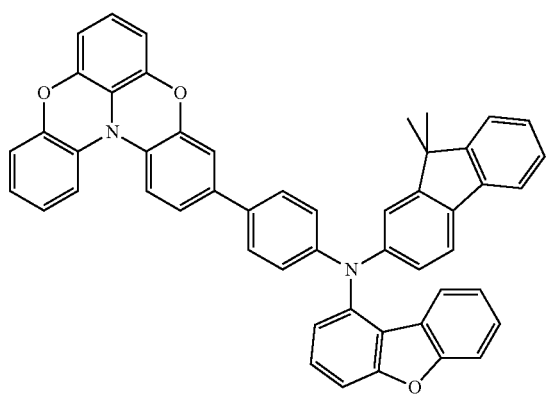
10
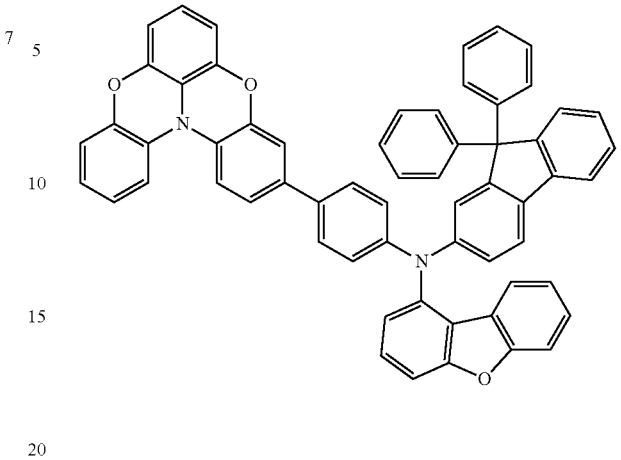
11
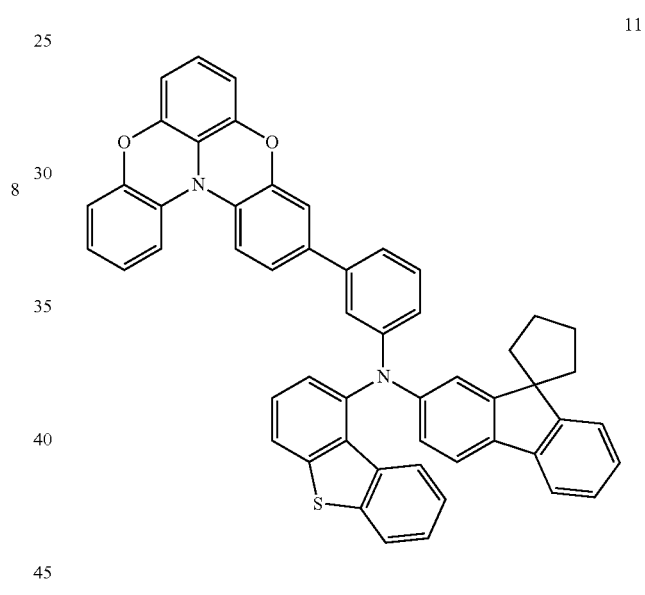
12
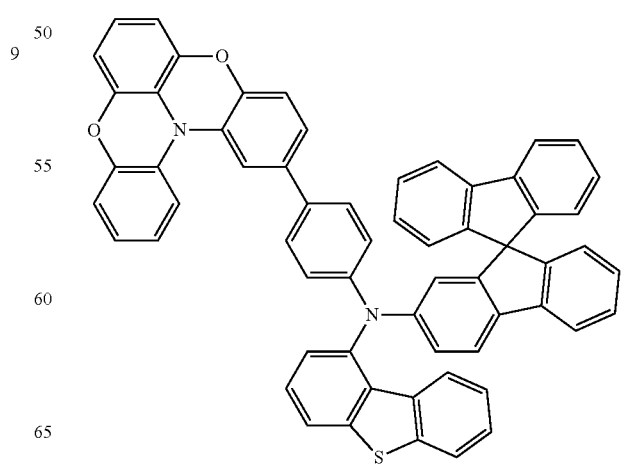

13
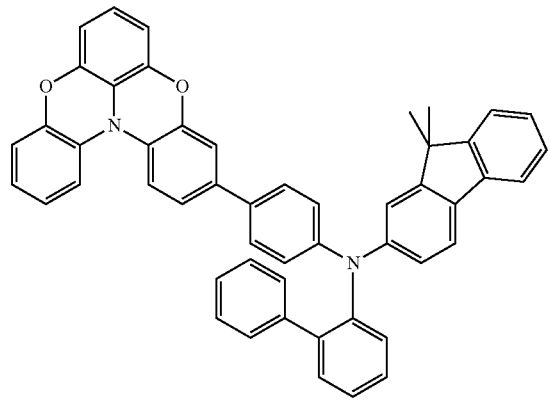
14
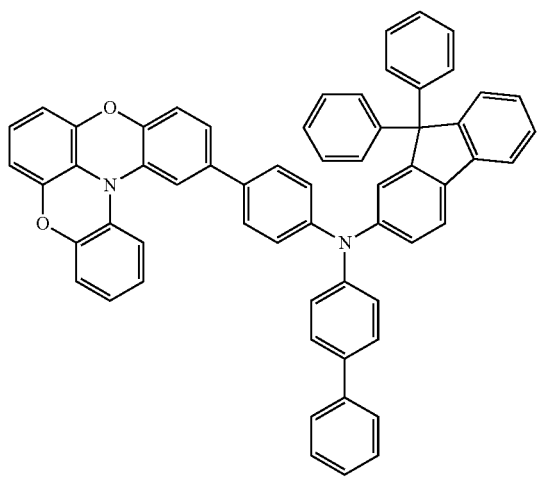
15
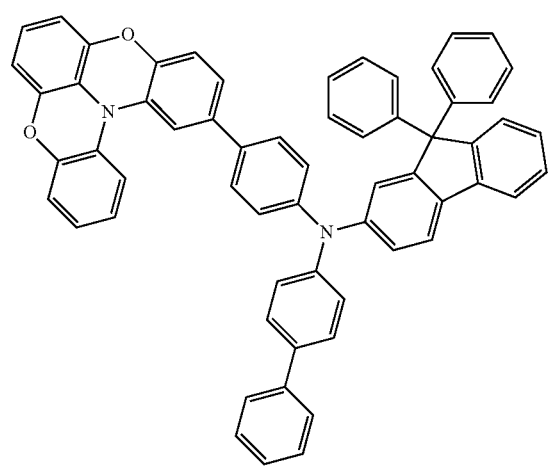
16
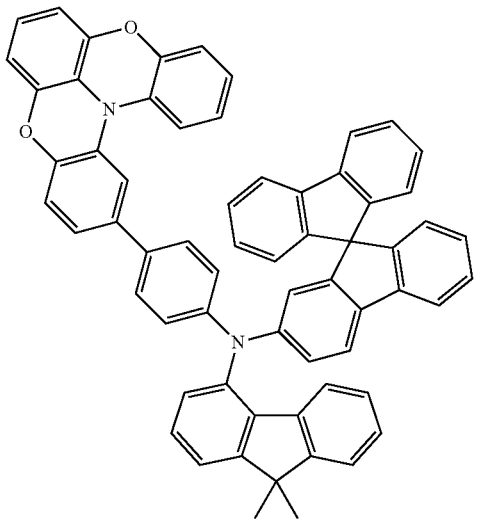
17
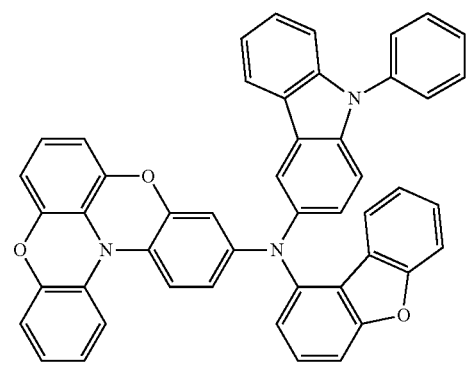
18
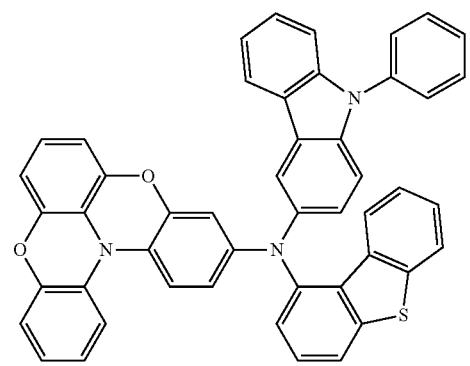

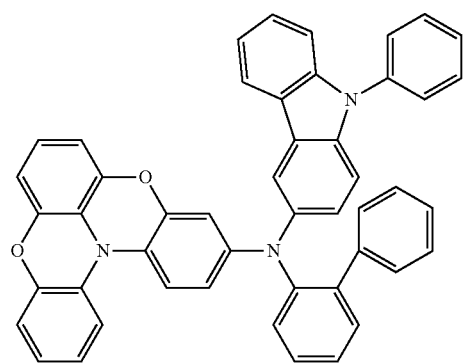
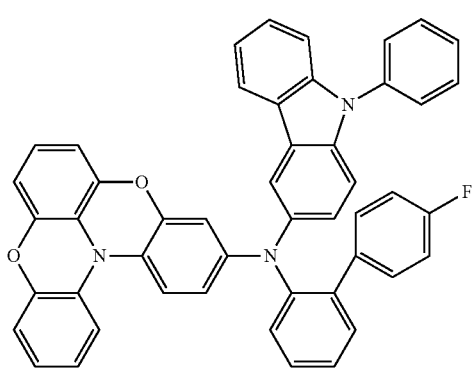
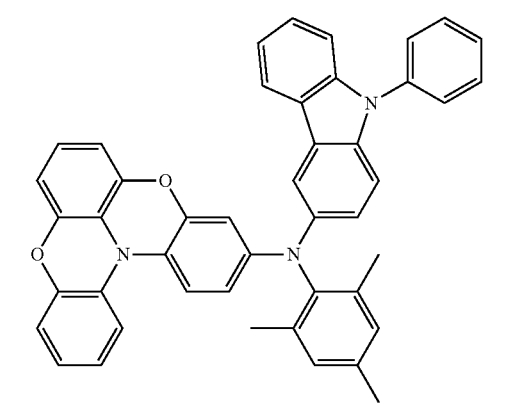
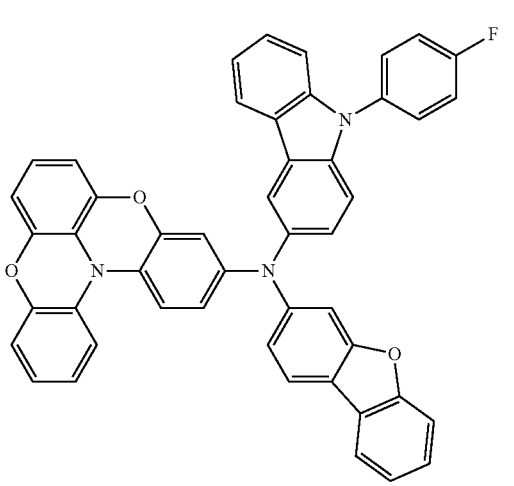
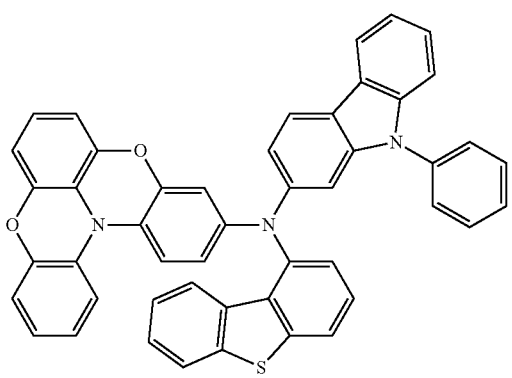

26
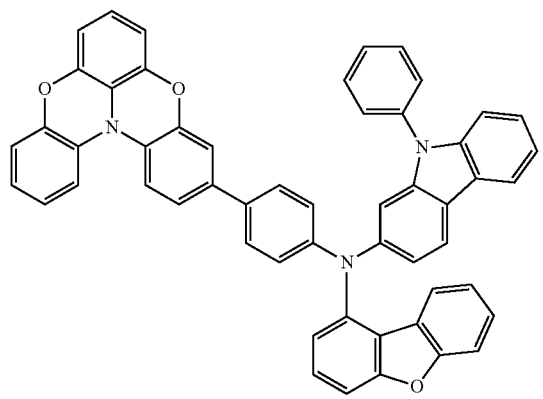
27
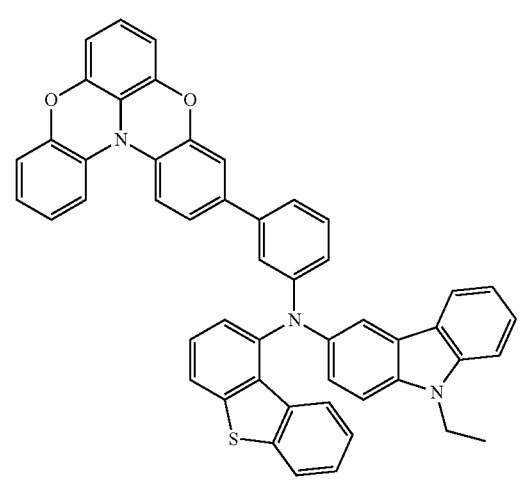
28
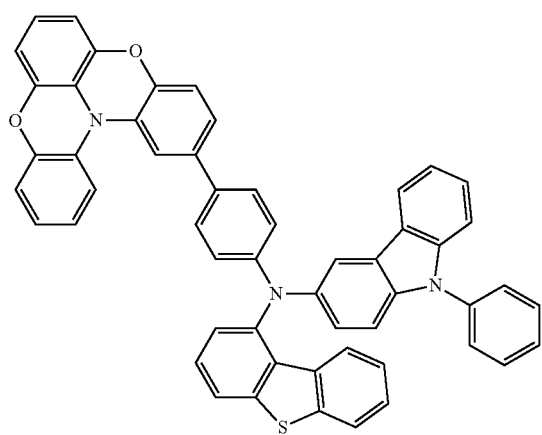
29
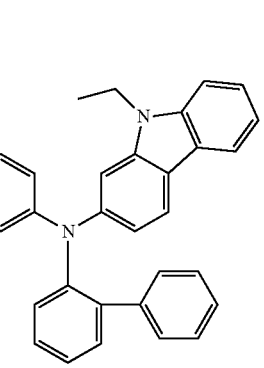
30
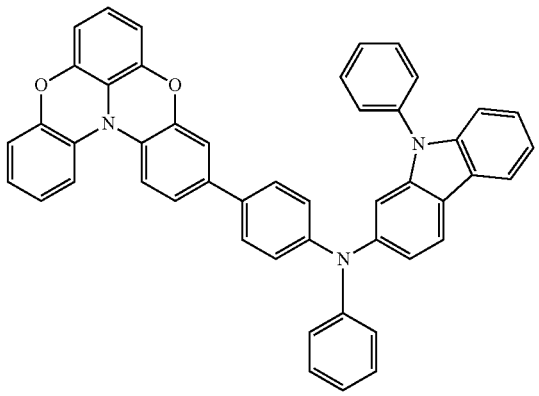
31

32
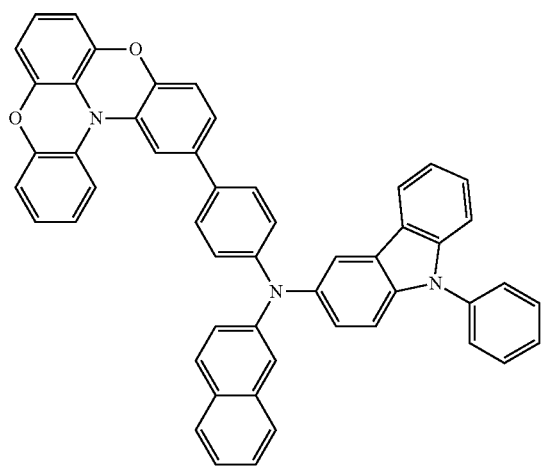
33
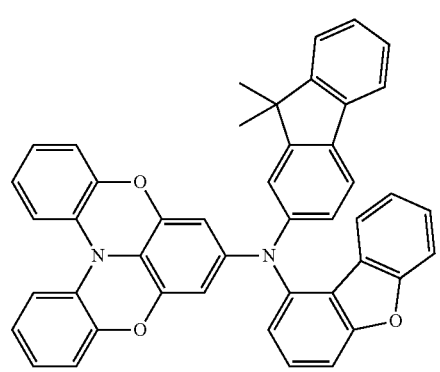
34
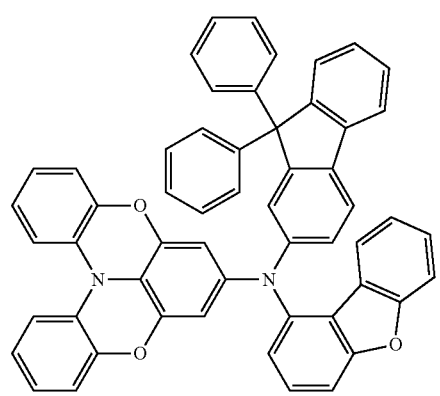
35
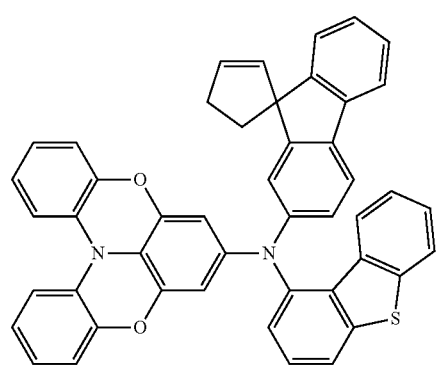
36
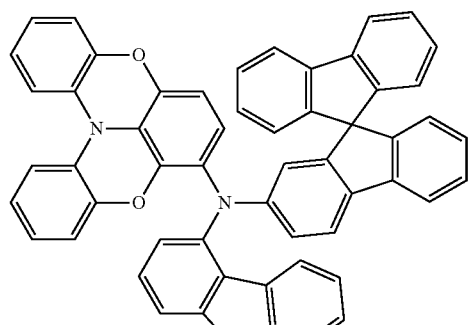
37
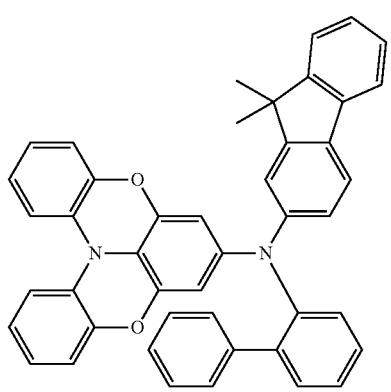
38
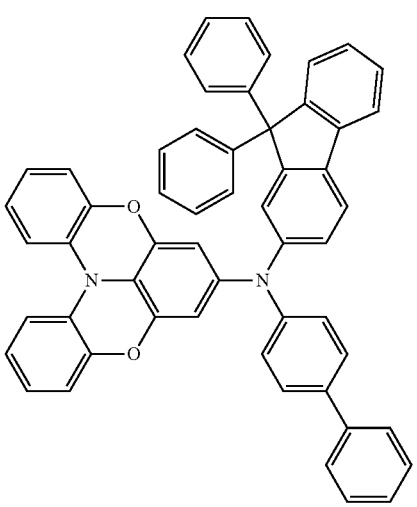
39
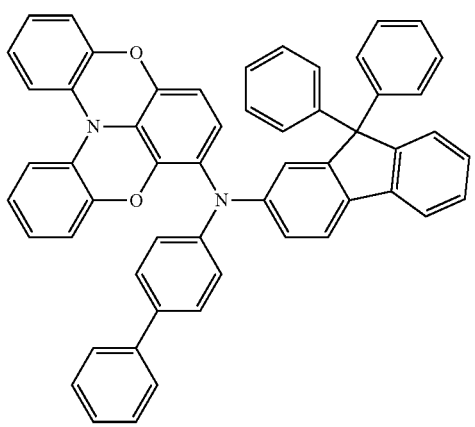

40
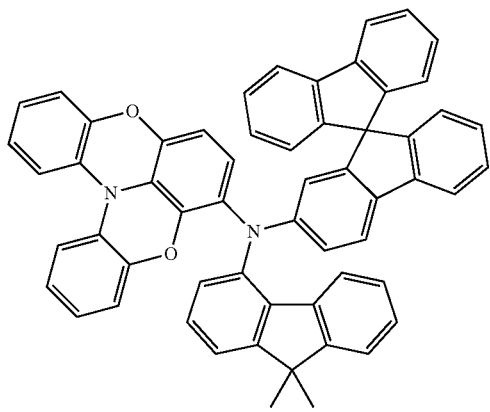
41
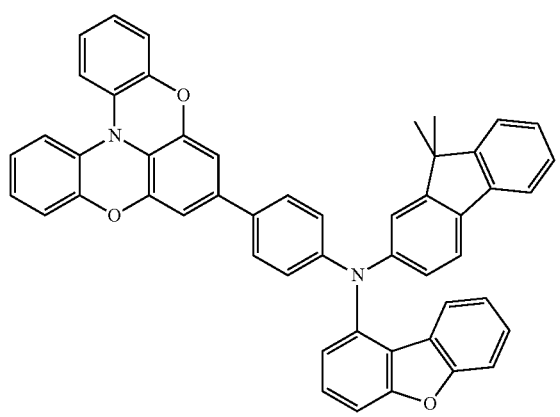
42
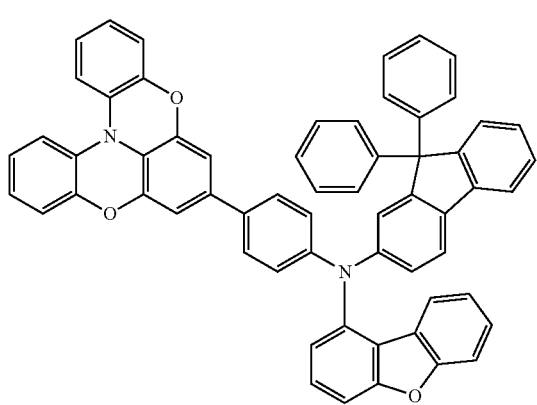
43
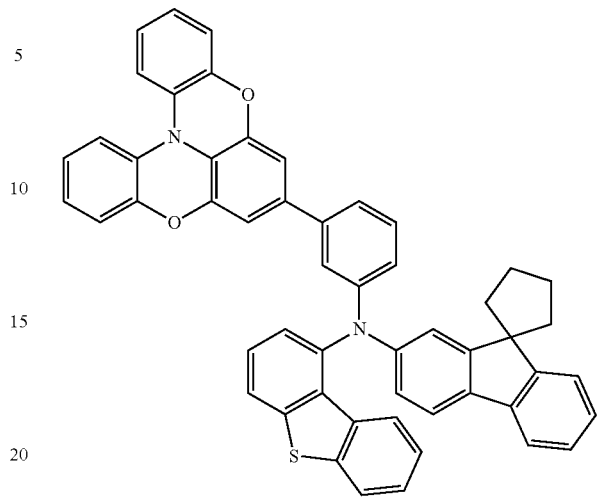
44
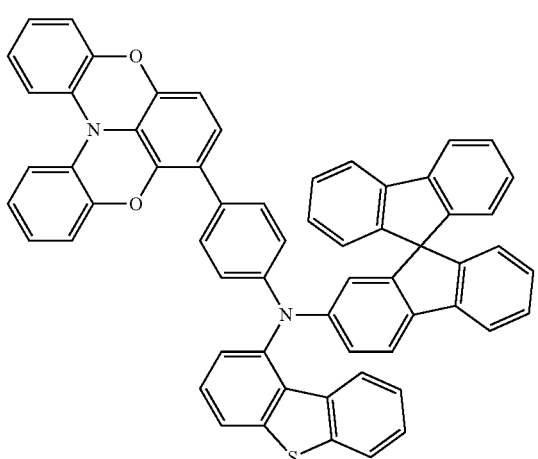
45
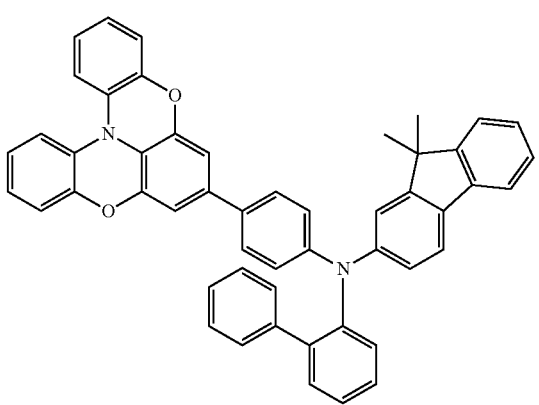

46
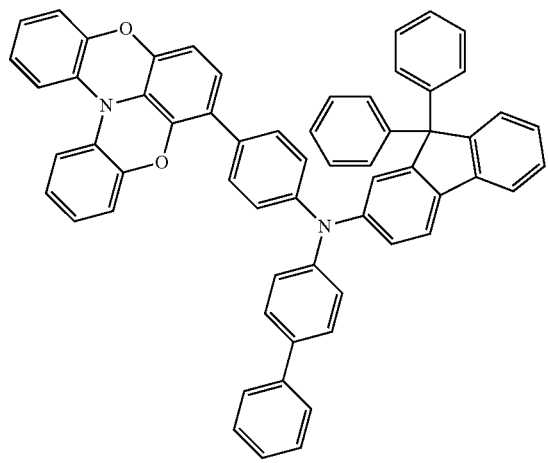
47
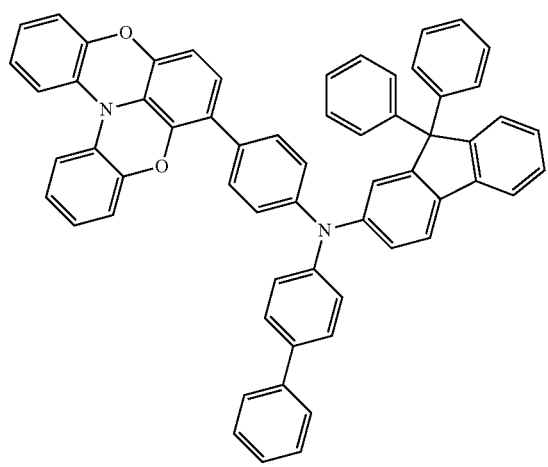
48
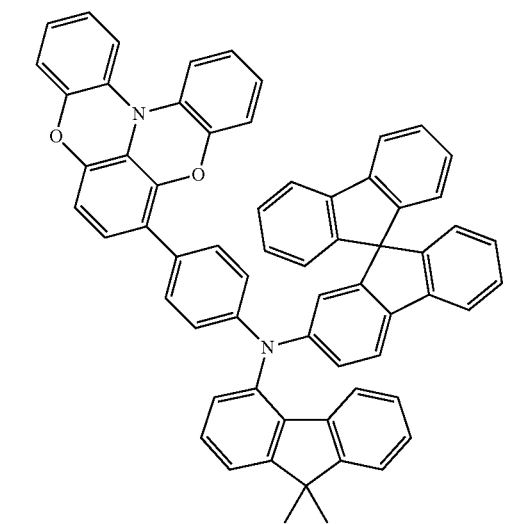
49
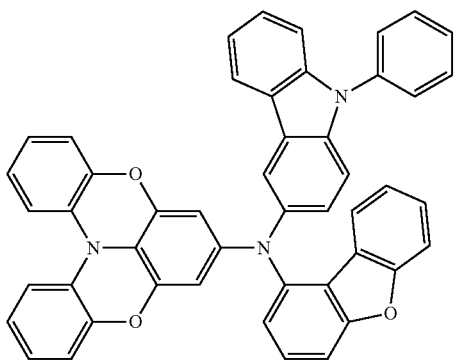
50
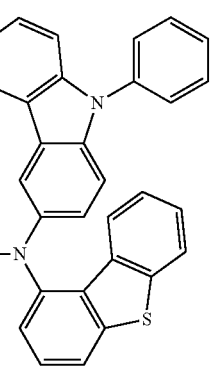
51
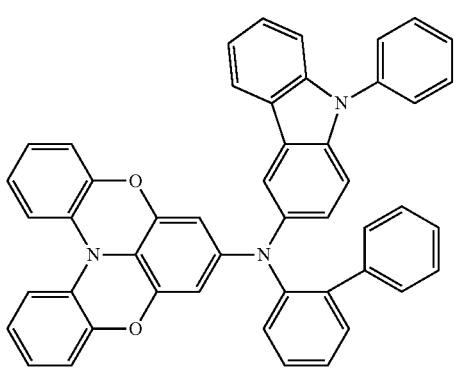
52
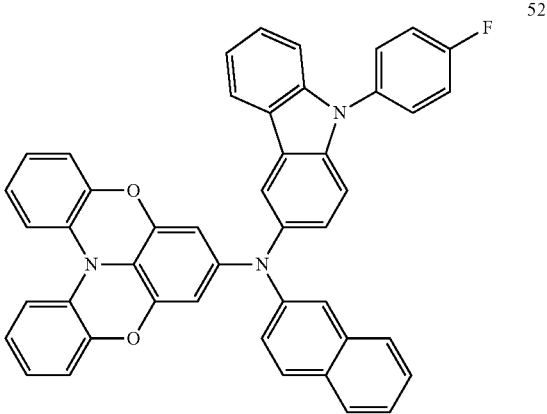

53
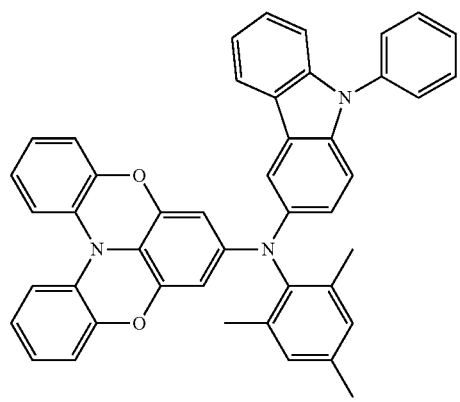
54
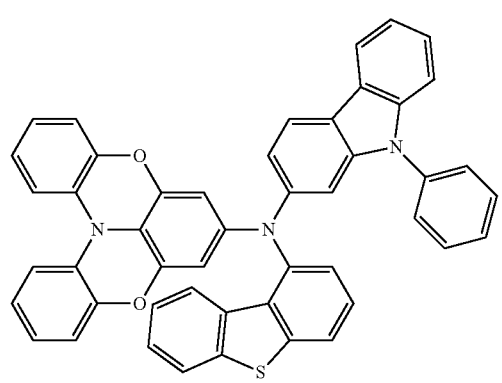
55
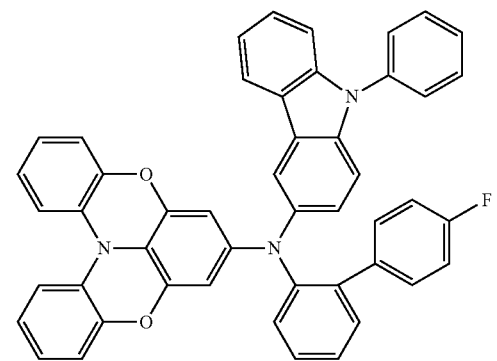
56
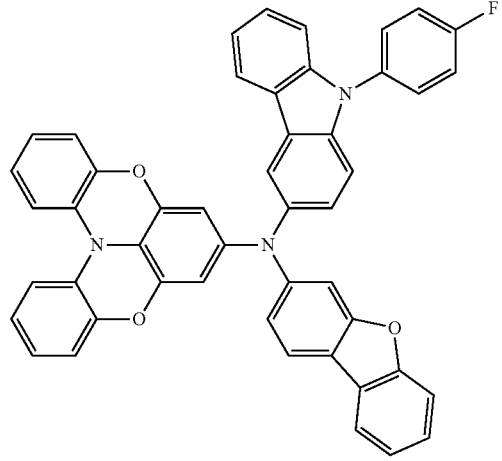
57
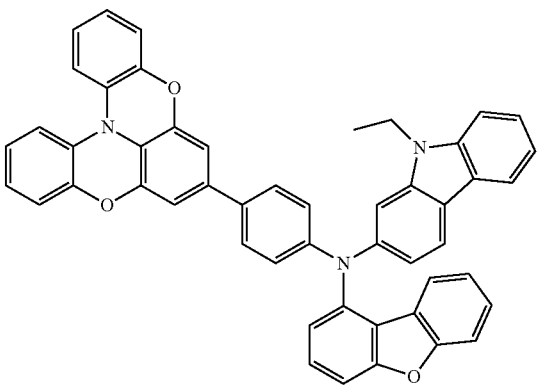
58
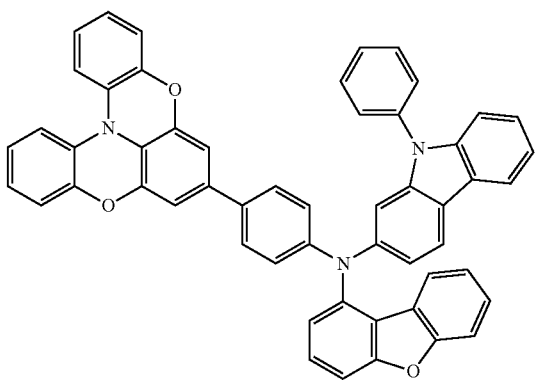
59
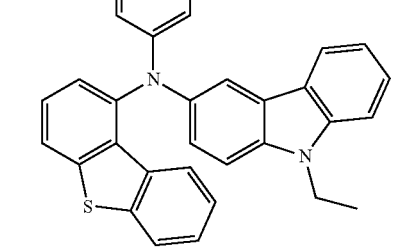

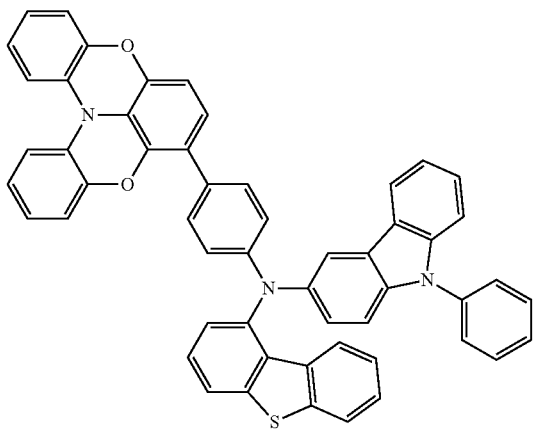

60

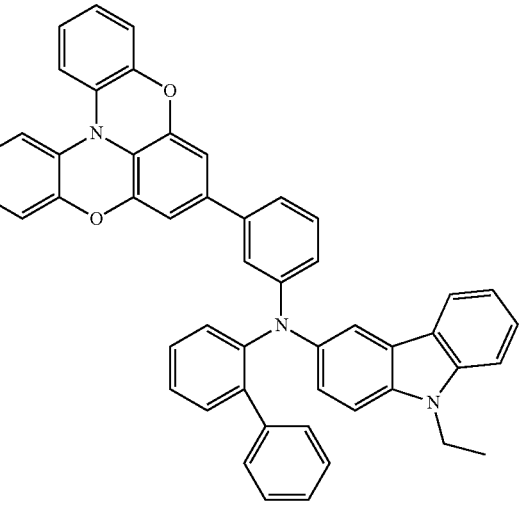

63

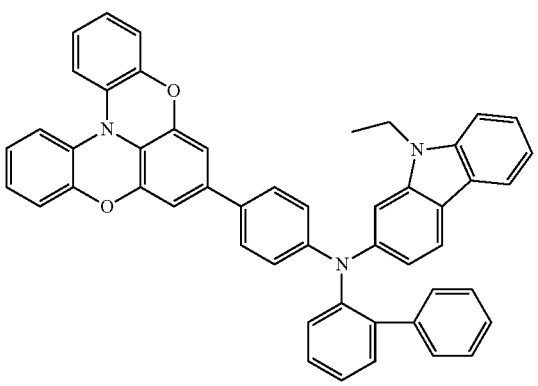

61

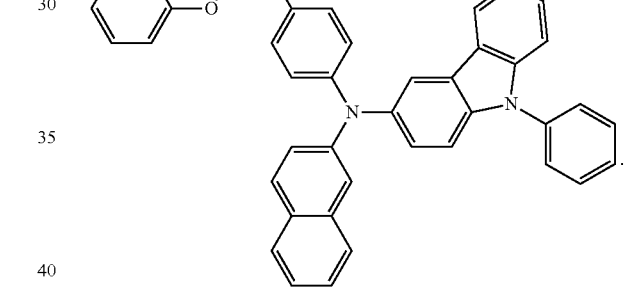

64

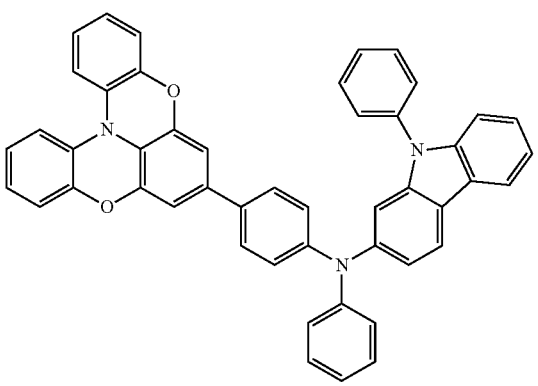

62

In some embodiments, the hole transport region HTR in the organic electroluminescence device 10 of an embodiment may include an existing material.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4'-tris(3-methylphenylphenylamino)triphenylamine (m-MTDATA), 4,4',4'-tris(N,N-diphenylamino)triphenylamine (TDATA), 4,4',4'-tris{N-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonicacid (PANI/DBSA), polyaniline/camphorsulfonicacid (PANI/CSA), polyaniline/poly(4-styrenesulfonate) (PANI/PSS), N,N'-di(naphthalene-I-yl)-N,N'-diphenyl-benzidine (NPB), N,N'-di(1-naphthyl)-N,N'-diphenyl-(1,1'-biphenyl)-4,4'-diamine (NPD), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives such as N-phenyl carbazole and polyvinyl carbazole, fluorine derivatives, N,N'-bis(3-methylphenyl)-N,N'-diphenyl-[1,1-biphenyl]-4,4'-diamine (TPD), triphenylamine derivatives such as 4,4',4'-tris(N-carbazolyl)triphenylamine (TCTA), N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-Bis(N-carbazolyl)benzene (mCP), 9-(4-tert-Butylphenyl)-3,6-bis(triphenylsilyl)-9H-carbazole (CzSi), etc.

The hole transport region HTR may have a thickness from about 100 Å to about 10,000 Å, for example, from about 100 Å to about 5,000 Å. The hole injection region HIL may have a thickness, for example, from about 30 Å to about 1,000 Å, the hole transport layer HTL may have a thickness from about 30 Å to about 1,000 Å. For example, the electron blocking layer may have a thickness from about 10 Å to about 1,000 Å. If the thickness of the hole transport area HTA, the hole injection layer HIL, the hole transport layer HTL, and the electron blocking layer satisfies the above-described range, suitable or satisfactory hole transport characteristics may be achieved without substantially increasing in driving voltage.

The hole transport region HTR may further include a charge generating material in addition to the above-described materials to improve conductivity (e.g., hole conductivity). The charge generating material may be uniformly or non-uniformly dispersed into the hole transport region HTR. The charge generating material may be, for example, a p-dopant. The p-dopant may be one of quinone derivatives, metal oxides, and cyano group-containing compounds, but is not limited thereto. For example, non-limiting examples of the p-dopant may include, but are not limited to, quinone derivatives such as tetracyanoquinodimethane (TCNQ) and 2,3,5,6-tetrafluoro-tetracyanoquinodimethane (F4-TCNQ), metal oxides such as tungsten oxides and molybdenum oxides.

As described herein above, the hole transport region HTR may further include at least one of the hole buffer layer or the electron blocking layer in addition to the hole injection layer HIL and the hole transport layer HTL. The hole buffer layer may compensate for a resonance distance according to the wavelength of light emitted from the emission layer EML to increase light emission efficiency. A material that can be contained in the hole transport region HTR may be used as a material to be contained in the hole buffer layer. The electron blocking layer is a layer playing the role of blocking the electron injection from the electron transport region ETR to the hole transport region HTR. When the hole transport region HTR includes at least one of the hole buffer layer or the electron blocking layer which are adjacent to the emission layer EML, the amine compound according to an embodiment may be included in the hole buffer layer and/or the electron blocking layer which are adjacent to the emission layer EML.

The emission layer EML is on the hole transport region HTR. The emission layer EML may have a thickness, for example, from about 100 Å to about 1,000 Å, or from about 100 Å to about 300 Å. The emission layer EML may have a multilayer structure having a single layer formed of a single material, a single layer formed of materials different from each other, or a plurality of layers formed of materials different from each other.

In addition, the emission layer EML of the organic electroluminescence device 10 may emit blue light. For example, the emission layer EML of the organic electroluminescence device 10 of an embodiment may emit blue light in the region of 490 nm or more (e.g., blue light having a wavelength of 490 nm or more). However, embodiments are not limited thereto, and the emission layer EML may emit green light or red light.

In some embodiments, the organic electroluminescence device 10 of an embodiment may include a plurality of emission layers. The plurality of emission layers may be sequentially laminated, for example, the organic electroluminescence device 10 including the plurality of emission layers may emit white light. The organic electroluminescence device including the plurality of emission layers may be an organic electroluminescence device having a tandem structure.

In an embodiment, the emission layer EML may be a delayed fluorescence emission layer, a fluorescence emission layer, a phosphorescence emission layer, etc., and the emission layer EML may include any suitable host materials and dopant used in the art.

As the host materials of the emission layer EML, any suitable materials used in the art may be used, and one selected from among fluoranthene derivatives, pyrene derivatives, arylacetylene derivatives, anthracene derivatives, fluorene derivatives, perylene derivatives, chrysene derivatives, etc. may be used, without specific limitation.

In some embodiments, the host materials may include pyrene derivatives, perylene derivatives, and anthracene derivatives. For example, as the host materials of the emission layer EML, anthracene derivatives represented by Formula 6 below may be used.

Formula 6

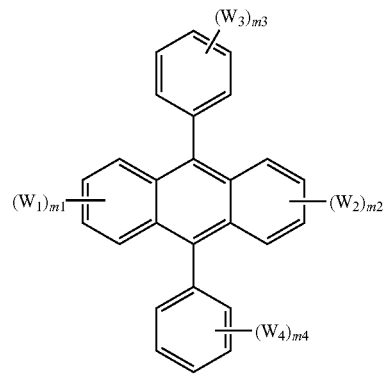

In Formula 6, W1 to W4 are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a ring, where m1 and m2 are each independently an integer of 0 to 4, and m3 and m4 are each independently an integer of 0 to 5.

If m1 is 1, W1 may not be a hydrogen atom, if m2 is 1, W2 may not be a hydrogen atom, if m3 is 1, W3 may not be a hydrogen atom, and if m4 is 1, W4 may not be a hydrogen atom.

If m1 is 2 or more, a plurality of W1 groups are the same or different. If m2 is 2 or more, a plurality of W2 groups are the same or different. If m3 is 2 or more, a plurality of W3 groups are the same or different. If m4 is 2 or more, a plurality of W4 groups are the same or different.

The compound represented by Formula 7 may include the compounds represented by the following structures, but the compound represented by Formula 7 is not limited thereto:
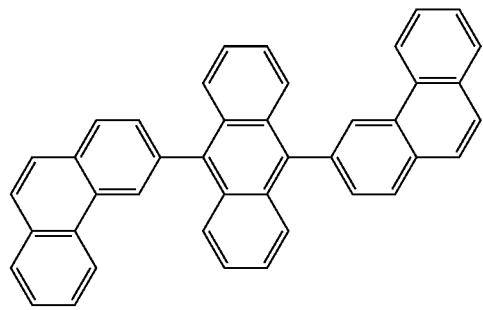
a-1
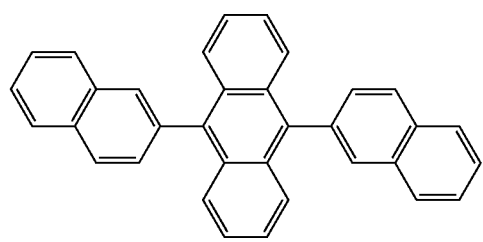
a-2
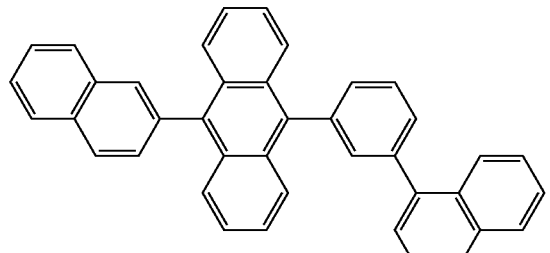
a-3
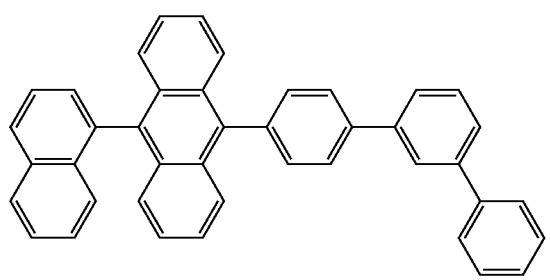
a-4
a-5
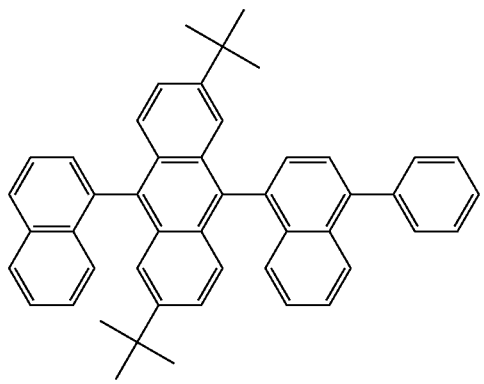
a-6
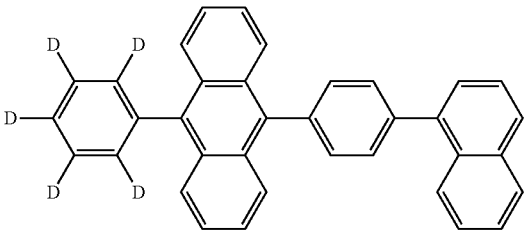
a-7
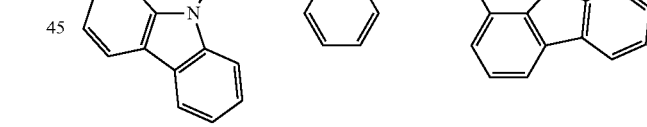
a-8
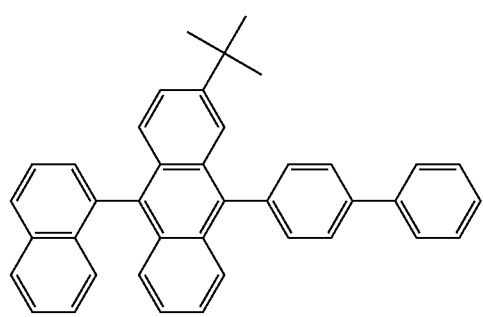
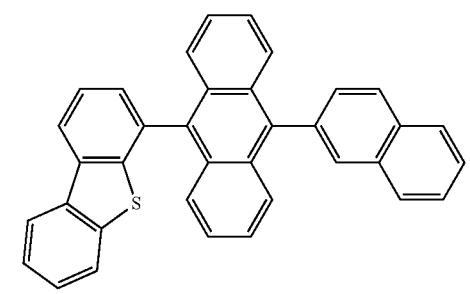
a-9

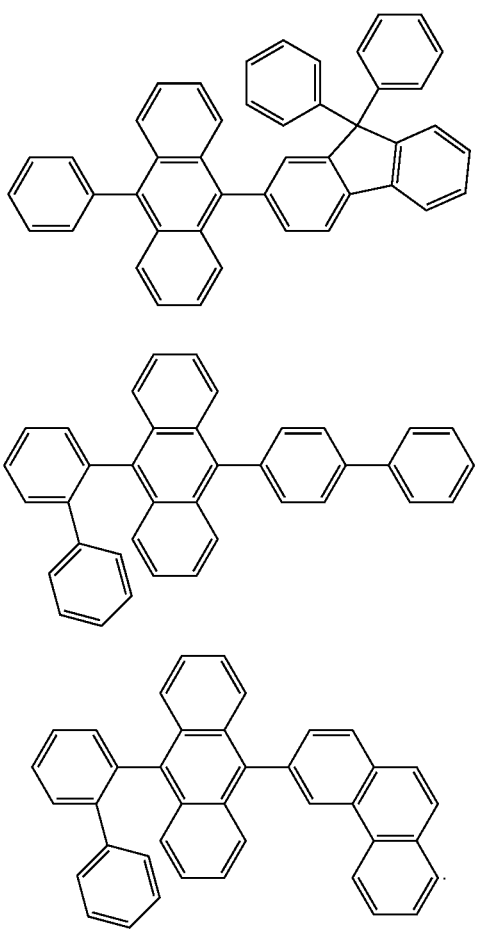

a-10 a-11 a-12

In an embodiment, the emission layer EML may include, as host materials, tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4''-Tris(carbazol-9-yl)-triphenylamine (TCTA), 1,3,5-tris(1-phenyl-1H-benzo[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis(naphthalen-2-yl)anthracene (MADN), bis[2-(diphenylphosphino)phenyl]etheroxide (DPEPO), Hexaphenyl cyclotriphosphazene (CP1), 1,4-bis(triphenylsilyl)benzene (UGH2), Hexaphenylcyclotrisiloxane (DPSiO3), Octaphenylcyclotetra siloxane (DPSiO4), 2,8-Bis(diphenylphosphoryl)dibenzofuran (PPF), 3,3'-bis(N-carbazolyl)-1,1'-biphenyl (mCBP), 1,3-Bis(N-carbazolyl)benzene (mCP), 9,10-di (naphthalen-2-yl)anthracene (DNA), etc. However, embodiments are not limited thereto, and any suitable delayed fluorescence emission host materials used in the art other than the listed host materials may be included.

In an embodiment, the emission layer EML may include, as a dopant, styryl derivatives (e.g., 1,4-bis[2-(3-N-ethyl-carbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and the derivatives thereof (e.g., 2,5,8,11-tetra-t-butylperylene (TBP)), pyrene and the derivatives thereof (e.g., 1,1'-dipyrene, 1,4-dipyrenylbenzene, 1,4-bis(N,N-diphenylamino)pyrene, and 1,6-bis(N,N-diphenylamino)pyrene), 2,5,8,11-tetra-t-butylperylene (TBP), etc.

Further, in an embodiment, the emission layer EML may include two dopant materials which having lowest triplet exciton energy levels (T1 level) that are different from each other. The emission layer EML of the organic electroluminescence device 10 of an embodiment may include a host having a first lowest triplet exciton energy level, a first dopant having a second lowest triplet exciton energy level lower than the first lowest triplet exciton energy level, and a second dopant having a third lowest triplet exciton energy level lower than the second lowest triplet exciton energy level.

In the organic electroluminescence device 10 of an embodiment including a host, a first dopant, and a second dopant in the emission layer EML, the first dopant may be a delayed fluorescence dopant, and the second dopant may be a fluorescence dopant.

For example, when the emission layer EML of the organic electroluminescence device 10 of an embodiment includes a plurality of dopants, the emission layer EML may include a first dopant and a second dopant which are different from each other. For example, when the emission layer EML emits blue light, the emission layer EML may further include, as a second dopant, any one selected from the group consisting of spiro-DPVBi, spiro-6P, distyryl-benzene (DSB), distyryl-arylene (DSA), polyfluorene (PFO)-based polymer and poly(p-phenylene vinylene (PPV)-based polymer. An organometallic complex or a metal complex such as (4,6-F2ppy)2Irpic, perylene and the derivatives thereof, etc. may be also used as a second dopant.

In the organic electroluminescence device 10 of an embodiment shown in FIGS. 1 to 3, the electron transport region ETR is on the emission layer EML. The electron transport region ETR may include, but is not limited to, at least one of the hole blocking layer, the electron transport layer ETL, or the electron injection layer EIL.

The electron transport region ETR may have a multilayer structure having a single layer formed of a single material, a single layer formed of materials different from each other, or a plurality of layers formed of materials different from each other.

For example, the electron transport region HTR may have a single layer structure of an electron injection layer EIL or an electron transport layer ETL, or a single layer structure formed of electron injection materials or electron transport materials. In addition, the electron transport region ETR may have a single layer structure formed of materials different from each other, or a structure of an electron transport layer ETL/an electron injection layer EIL, a hole blocking layer/an electron transport layer ETL/an electron injection layer (EIL) which are sequentially laminated from the emission layer EML, but embodiments are not limited thereto. The electron transport region ETR may have a thickness, for example, from about 100 Å to about 1,500 Å.

The electron transport area ETA may be formed by using various suitable methods such as a vacuum deposition method, a spin coating method, a casting method, a Langmuir-Blodgett (LB) method, an inkjet printing method, a laser printing method, and a laser induced thermal imaging (LITI) method.

If the electron transport region ETR includes the electron transport layer ETL, the electron transport region ETR may include an anthracene-based compound. However, embodiments are not limited thereto, and the electron transport region may include, for example, tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di (naphthalene-2-yl)anthracene (ADN), diphenyl(4-(triphenylsilyl)phenyl)phosphine oxide (TSPO1), or a mixture thereof. The thickness of the electron transport layers ETL may be from about 100 Å to about 1,000 Å, for example, from about 150 Å to about 500 Å. If the thickness of the electron the hole layers ETL satisfies the above-described range, suitable or satisfactory electron transport characteristics may be achieved without substantially increasing in driving voltage.

If the electron transport region ETR includes the electron injection layer EIL, the electron transport region ETR may be formed using metal halides such as LiF, NaCl, CsF, RbCl, RbI, and CuI, lanthanum metals such as Yb, metal oxides such as Li2O and BaO, Lithium quinolate (LiQ), etc., but embodiments are not limited thereto. The electron injection layer EIL may be also formed of a mixture of an electron transport material and an organo metal salt. The organo metal salt may be a material having an energy band gap of about 4 eV or more. For example, the organo metal salt may include metal acetate, metal benzoate, metal acetoacetate, metal acetylacetonate or metal stearate. The thickness of the electron injection layers EIL may have a thickness from about 1 Å to about 500 Å, for example, about 3 Å to about 300 Å. If the thickness of the electron injection layers EIL satisfies the above-described range, suitable or satisfactory electron injection characteristics may be achieved without substantially increasing in driving voltage.

As described herein above, the electron transport region ETR may include the hole blocking layer. The hole blocking layer may include, for example, at least one of 2,9-dimethyl-4,7-diphenyl-1,10-phenanthroline (BCP), or 4,7-diphenyl-1,10-phenanthroline (Bphen), but is not limited thereto.

The second electrode EL2 is on the electron transport region ETR. The second electrode EL2 may be a common electrode or a negative electrode. The second electrode EL2 may be a transmissive electrode, a transflective electrode, or a reflective electrode. When the second electrode EL2 is the transmissive electrode, the second electrode EL2 may be formed of transparent metal oxides, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) including the same. In some embodiments, the second electrode EL2 may have a multi-layered structure including a reflective layer or transflective layer and a transparent conductive layer formed of indium tin oxide (ITO), indium zinc oxide (IZO), zinc oxide (ZnO), or indium tin zinc oxide (ITZO).

In some embodiments, the second electrode EL may be connected to an auxiliary electrode. When the second electrode EL2 is connected to the auxiliary electrode, resistance of the second electrode EL2 may be decreased.

In some embodiments, a capping layer CPL may be further on the second electrode EL2 of the organic electroluminescence device 10 of an embodiment. The capping layer CPL may include, for example, α-NPD, NPB, TPD, m-MTDATA, Alq3, CuPc, N4,N4,N4',N4'-tetra (biphenyl-4-yl) biphenyl-4,4'-diamine (TPD15), 4,4',4''-Tris (carbazol sol-9-yl) triphenylamine (TCTA), N, N'-bis (naphthalen-1-yl), etc.

The amine compound of an embodiment as described herein above includes a five-ring condensed hetero compound (e.g., a condensed hetero compound including five rings) as a substituent of the amine group, and the five-ring condensed hetero compound is the compound in which three aryl rings link one another via one nitrogen atom and two oxygen atoms, and thus, form five rings, and a nitrogen atom may be located in the center of the five rings. Accordingly, the amine compound according to an embodiment may improve the ability of a hole transport between molecules by increasing the flatness of the core of the five-ring condensed hetero compound, and when the amine compound is used as a hole transport material of the organic electroluminescence device, a long lifespan and high efficiency of the organic electroluminescence device may be achieved. For example, an embodiment of the amine compound includes a condensed hetero compound having five rings that are substantially in a single plane (e.g., respective centers of the five rings are all substantially in the same plane), and thus, the core of the amine compound (e.g., the hetero compound including five rings) is substantially flat. While the present disclosure is not limited by any particular mechanism or theory, it is believed that the flatness of the hetero compound including the five rings improves the hole transport abilities and stability of the amine compound.

Hereinafter, the amine compound according to an embodiment of the inventive concept will be explained in more detail by referring to example embodiments and comparative embodiments. The embodiments are only illustrations for assisting the understanding of the subject matter of the present disclosure, and the scope of the present disclosure is not limited thereto.

EXAMPLES

1. Synthesis of Amine Compound

First, a synthetic method of the amine compound according to the current embodiment will be described by illustrating synthetic methods of compound 1, compound 4, compound 22, and compound 25. In the following descriptions, a synthetic method of the amine compound is provided as an example, but the synthetic method according to an embodiment of the present disclosure is not limited to the following examples.

(1) Synthesis of Compound 1

Amine compound 1 (Compound 1) according to an embodiment may be synthesized by, for example, the following reaction.

(Synthesis of Intermediate Compound A-1)

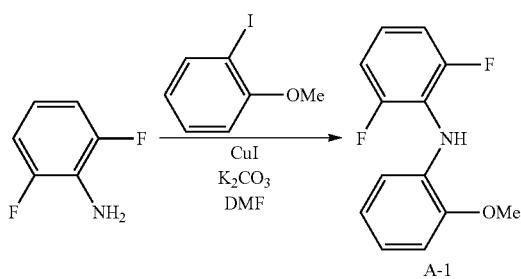

2,6-difluoroaniline (12.9 g, 100 mmol), 2-iodoanisole (23.3 g), CuI (19.5 g, 100 mmol), and K$_2$CO$_3$ (25.8 g, 200 mmol) were added to a dimethylformamide (DMF) solution (200 ml), and then stirred at about 150° C. for about 96 hours. After the reaction was believed to be completed, the temperature of the reaction solution was decreased to room temperature and extracted with ethyl acetate/H$_2$O three times. The resultant product was dried with anhydrous magnesium sulfate and purified by column chromatography utilizing a mixed solvent (MC:HEX=1:10) to obtain Intermediate A-1 (18.8 g, yield: 80%).

Synthesis of Intermediate Compound A-2

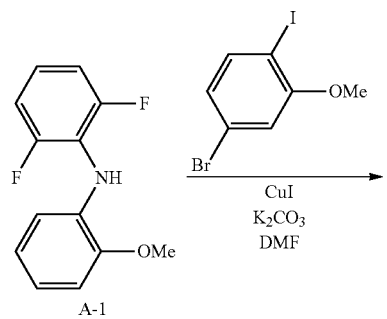

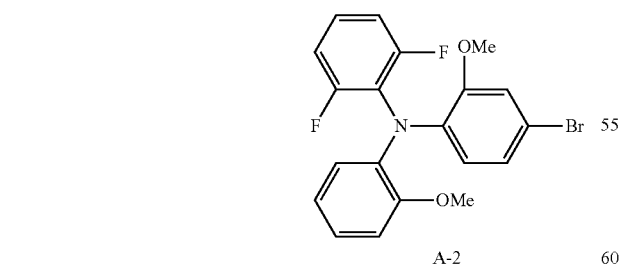

Intermediate A-2 (25.2 g, yield: 75%) was obtained using substantially the same method as the synthesis of Intermediate A-1, except for using Intermediate A-1 instead of 2,6-difluoroaniline, and 4-bromo-1-iodo-2-methoxybenzene instead of 2-iodoanisole.

Synthesis of Intermediate Compound A-3

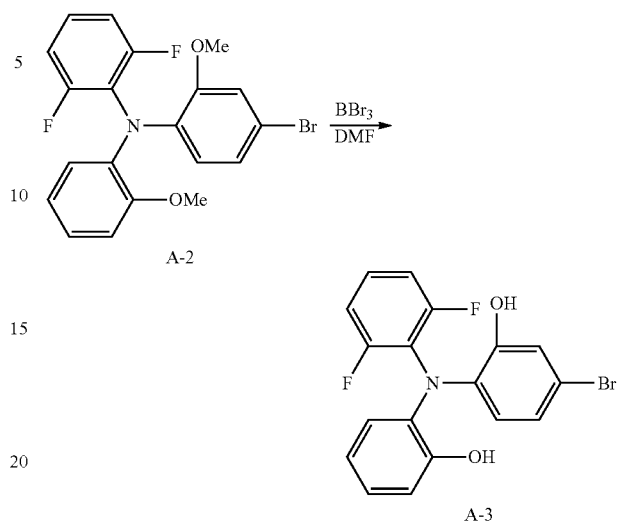

Intermediate A-2 (25.2 g, 60 mmol) was added to a DMF solution (300 ml) and then stirred at about 0° C. for about 1 hour. BBr$_3$ (30 g, 120 mmol) was added thereto dropwise for about 1 hour, and then stirring was performed at room temperature for about 4 hours. The resultant product was extracted with MC/H$_2$O three times. The resultant product was dried with anhydrous magnesium sulfate and purified by column chromatography utilizing a mixed solvent (MC:HEX=1:4) to obtain Intermediate A-3 (19.6 g, yield: 83%).

Synthesis of Intermediate Compound A

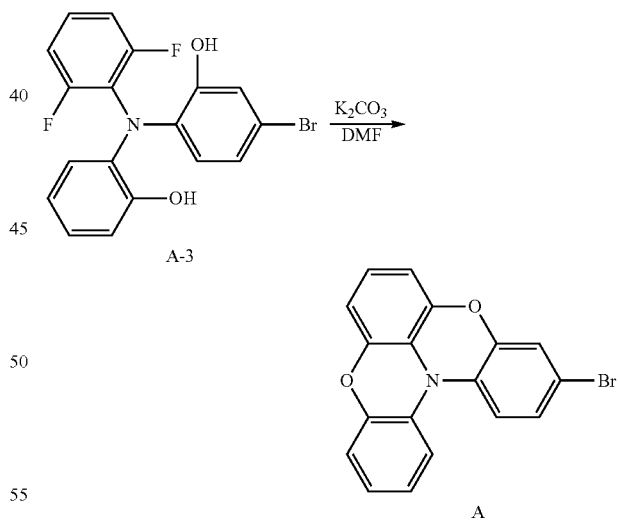

Intermediate A-3 (19.6 g, 50 mmol) and K$_2$CO$_3$ (13.8 g, 100 mmol) were added to a DMF solution (200 ml), and then stirred at about 150° C. for about 4 hours. After the reaction was believed to be completed, the temperature of the reaction solution was decreased to room temperature and extracted with ethyl acetate/H$_2$O three times. The resultant product was dried with anhydrous magnesium sulfate and purified by column chromatography utilizing a mixed solvent (MC:HEX=1:10) to obtain Intermediate A factor (13 g, yield: 80%).

Synthesis of Compound 1

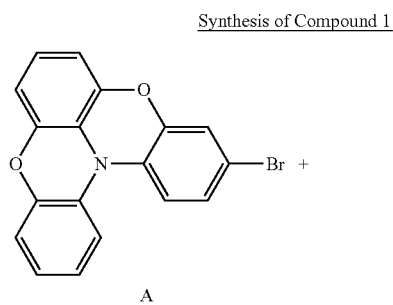

Synthesis of Compound 2

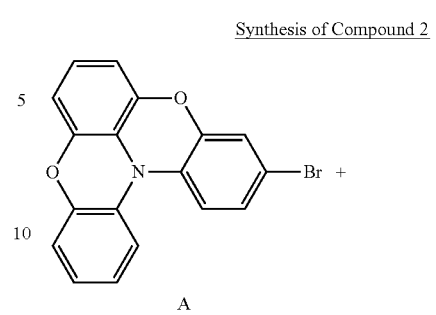

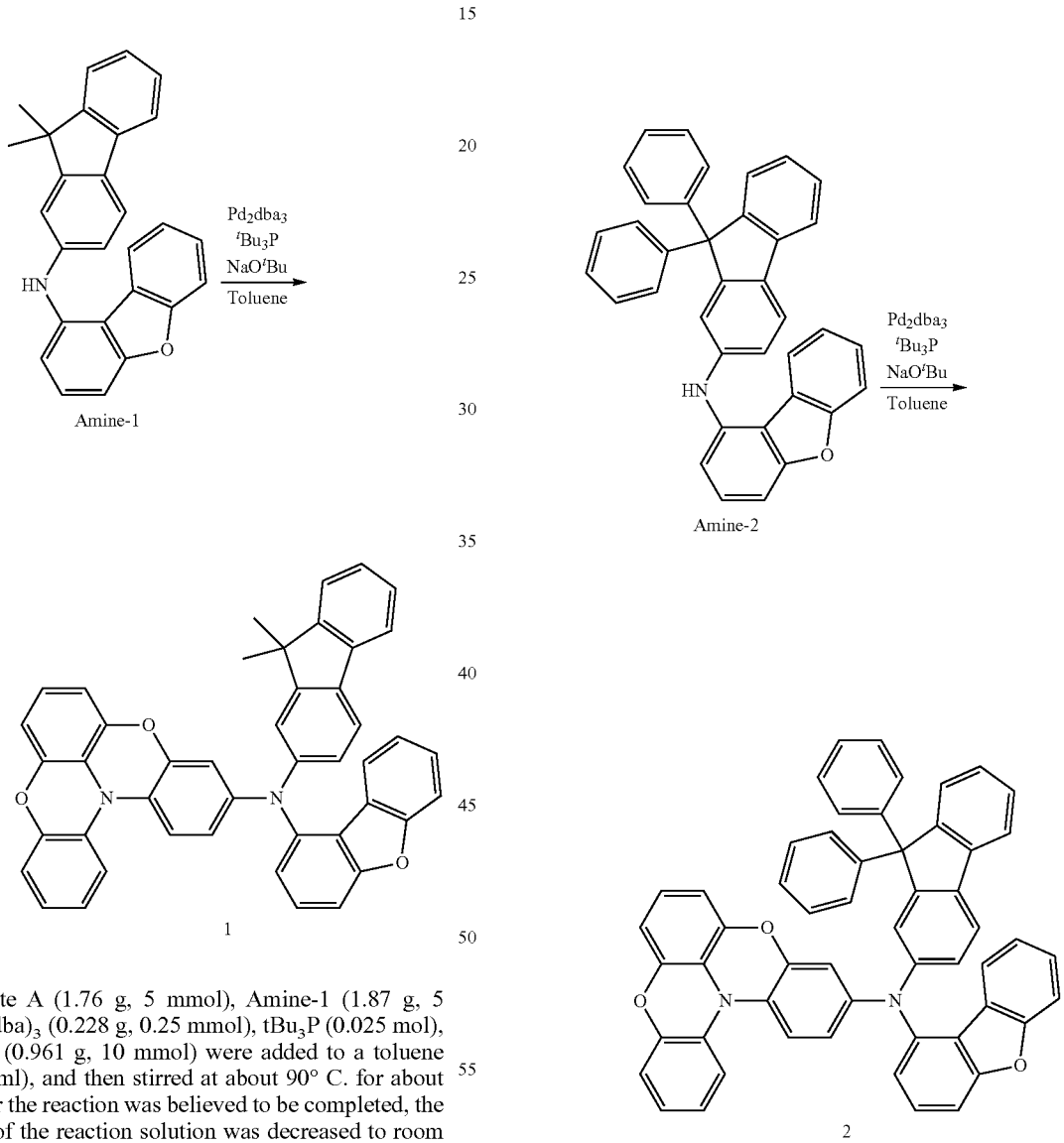

Intermediate A (1.76 g, 5 mmol), Amine-1 (1.87 g, 5 mmol), Pd$_2$(dba)$_3$ (0.228 g, 0.25 mmol), tBu$_3$P (0.025 mol), and NaOtBu (0.961 g, 10 mmol) were added to a toluene solution (50 ml), and then stirred at about 90° C. for about 2 hours. After the reaction was believed to be completed, the temperature of the reaction solution was decreased to room temperature and extracted with ethyl acetate/H$_2$O three times. The resultant product was dried with anhydrous magnesium sulfate and purified by column chromatography utilizing a mixed solvent (MC:HEX=1:5) to obtain compound 1 (2.58 g, yield: 80%).

(2) Synthesis of Compound 2

Amine compound 2 (Compound 2) according to an embodiment may be synthesized by, for example, the following reaction.

Compound 2 (3.08 g, yield: 80%) was obtained using substantially the same method as the synthesis of Compound 1, except for using Amine-2 instead of Amine-1.

(1) Synthesis of Compound 4

Amine compound 4 (Compound 4) according to an embodiment may be synthesized by, for example, the following reaction.

Synthesis of Intermediate Compound B-1

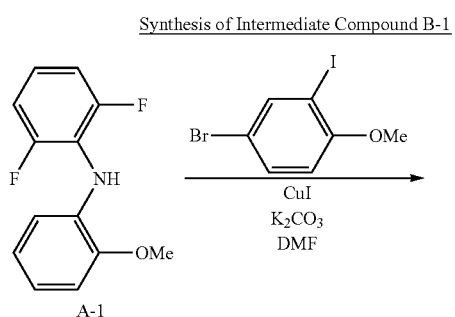

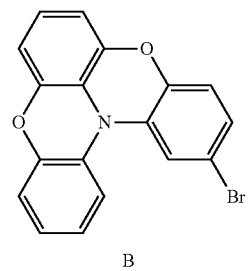

Intermediate B (13 g, yield: 80%) was obtained using substantially the same method as the synthesis of Intermediate A, except for using Intermediate B-2 instead of Intermediate A-3.

Intermediate B-1 (25.2 g, yield: 75%) was obtained using substantially the same method as the synthesis of Intermediate A-2, except for using 5-bromo-1-iodo-2-methoxy benzene instead of 4-bromo-1-iodo-2-methoxybenzene.

Synthesis of Intermediate Compound B-2

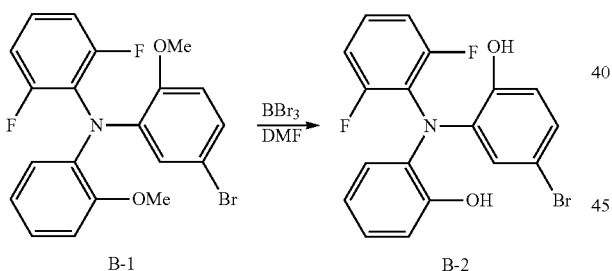

Intermediate B-2 (19.6 g, yield: 83%) was obtained using substantially the same method as the synthesis of Intermediate A-3, except for using Intermediate B-1 instead of Intermediate A-2.

Synthesis of Intermediate Compound B

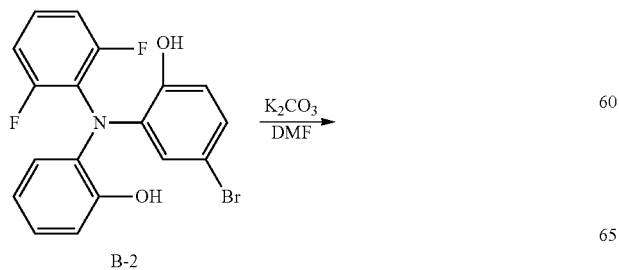

Synthesis of Compound 4

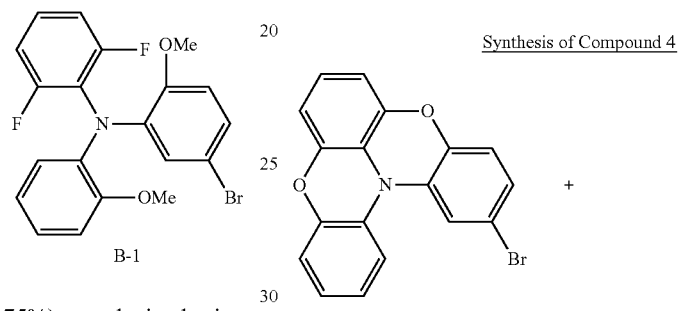

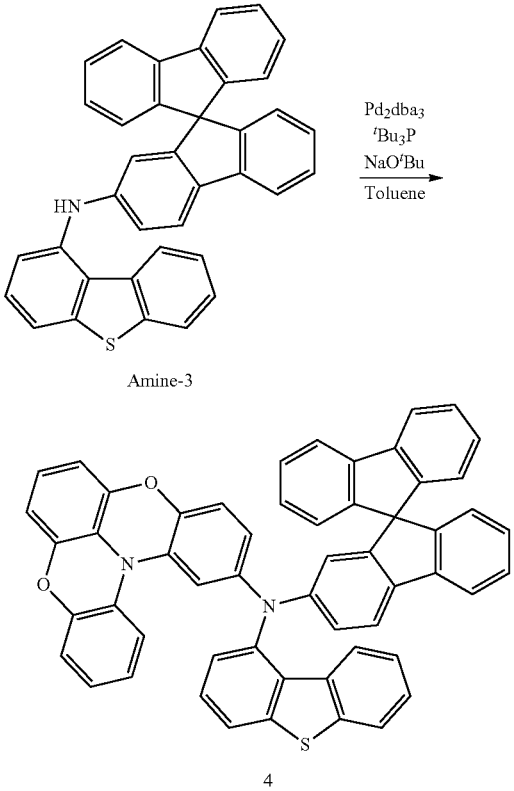

Compound 4 (3.13 g, yield: 80%) was obtained using substantially the same method as the synthesis of Compound 1, except for using Intermediate B instead of Intermediate A, and Amine-3 instead of Amine-1.

(4) Synthesis of Compound 8

Amine compound 8 according to an embodiment may be synthesized by, for example, the following reaction.

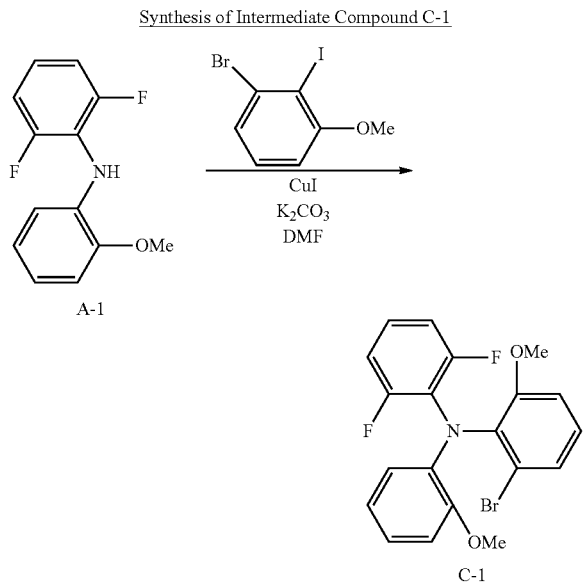

Intermediate C-1 (25.2 g, yield: 75%) was obtained using substantially the same method as the synthesis of Intermediate A-2, except for using 6-bromo-1-iodo-2-methoxy benzene instead of 4-bromo-1-iodo-2-methoxybenzene.

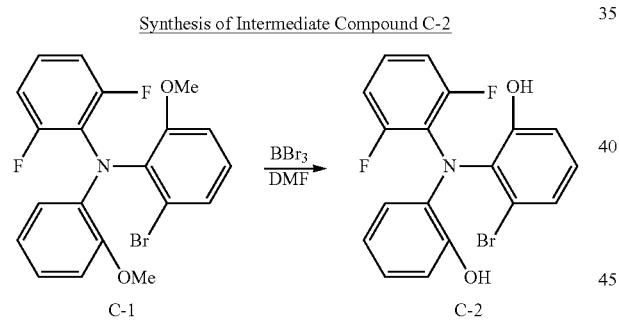

Intermediate C-2 (19.6 g, yield: 83%) was obtained using substantially the same method as the synthesis of Intermediate A-2, except for using Intermediate C-1 instead of Intermediate A-2.

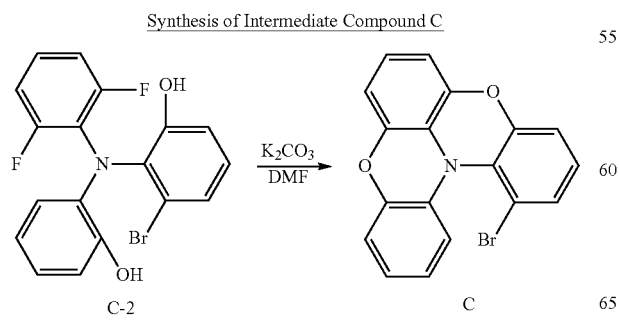

Intermediate C (13 g, yield: 80%) was obtained using substantially the same method as the synthesis of Intermediate A, except for using Intermediate C-2 instead of Intermediate A-3.

(Synthesis of Compound 8)

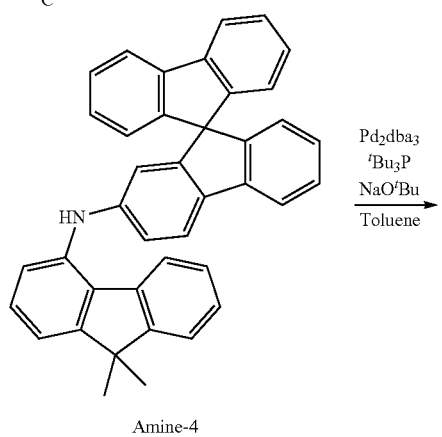

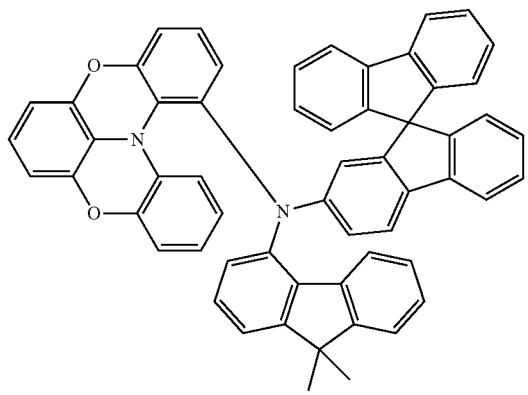

Compound 8 (3.17 g, yield: 80%) was obtained using substantially the same method as the synthesis of Compound 1, except for using Intermediate C instead of Intermediate A, and Amine-4 instead of Amine-1.

(5) Synthesis of Compound 23

Amine compound 23 (Compound 23) according to an embodiment may be synthesized by, for example, the following reaction.

Synthesis of Compound 23

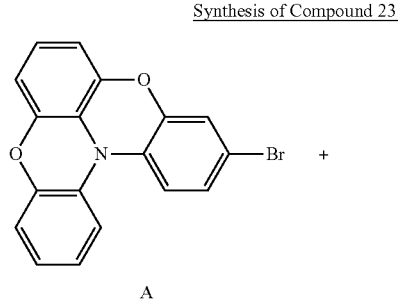

A

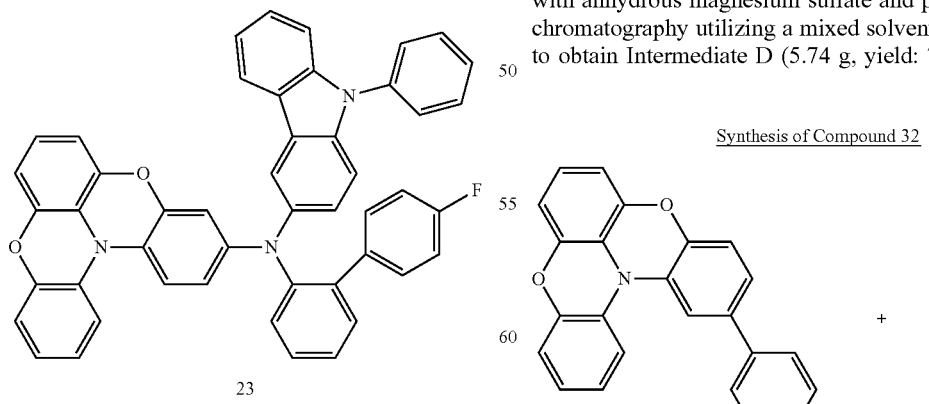

Compound 23 (2.79 g, yield: 80%) was obtained using substantially the same method as the synthesis of Compound 1, except for using Amine-5 instead of Amine-1.

(6) Synthesis of Compound 32

Amine compound 32 according to an embodiment may be synthesized by, for example, the following reaction.

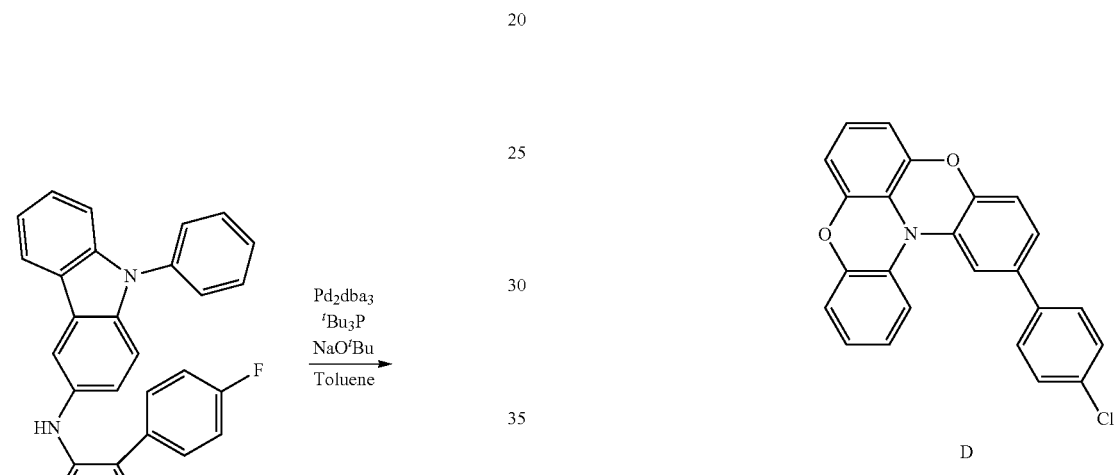

Intermediate B (7.04 g, 20 mmol), (4-chlorophenyl)boronic acid (3.12 g, 20 mmol), $(Ph_3)_4Pd$ (0.293 g, 0.25 mmol), and $K_2CO_3$ (4.14 g, 30 mmol) were added to a solution ($THF/H_2O$=1:1, 100 ml) and then stirred at about 80° C. for about 12 hours. After the reaction was believed to be completed, the temperature of the reaction solution was decreased to room temperature and extracted with ethyl acetate/$H_2O$ three times. The resultant product was dried with anhydrous magnesium sulfate and purified by column chromatography utilizing a mixed solvent (MC:HEX=1:10) to obtain Intermediate D (5.74 g, yield: 75%).

Synthesis of Compound 32

-continued

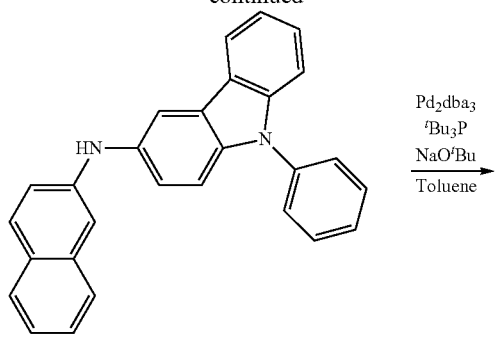

Amine-6

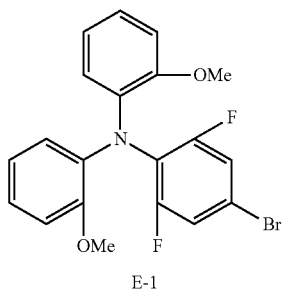

E-1

Intermediate E-1 (25.2 g, yield: 60%) was obtained using substantially the same method as the synthesis of Intermediate A-1, except for using 4-bromo-2,6-difluoroaniline instead of 2,6-difluoroaniline.

Synthesis of Intermediate Compound E-2

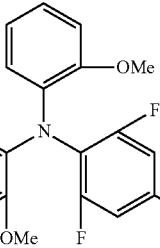

E-1

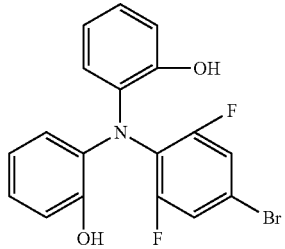

E-2

Intermediate E-2 (18.8 g, yield: 80%) was obtained using substantially the same method as the synthesis of Intermediate A-3, except for using Intermediate E-1 instead of Intermediate A-2.

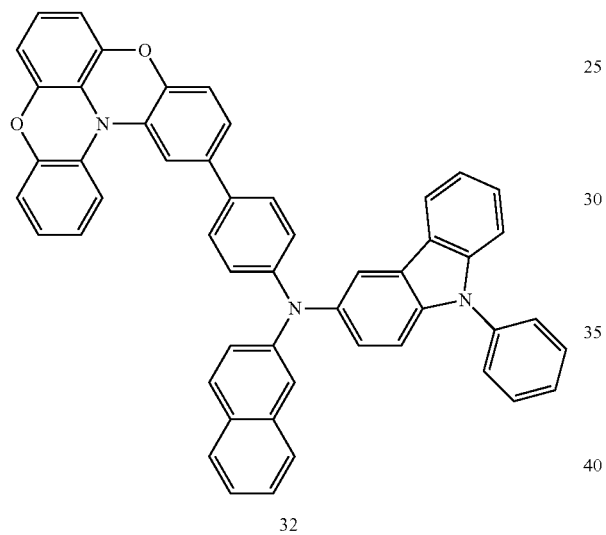

32

Compound 32 (2.92 g, yield: 80%) was obtained using substantially the same method as the synthesis of Compound 1, except for using Intermediate D instead of Intermediate A, and Amine-6 instead of Amine-1.

(7) Synthesis of Compound 62

Amine compound 62 according to an embodiment may be synthesized by, for example, the following reaction.

Synthesis of Intermediate Compound E-1

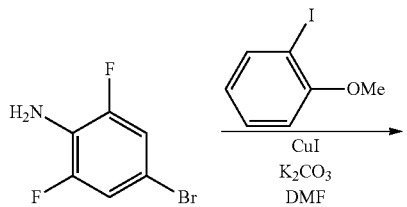

Synthesis of Intermediate Compound E-3

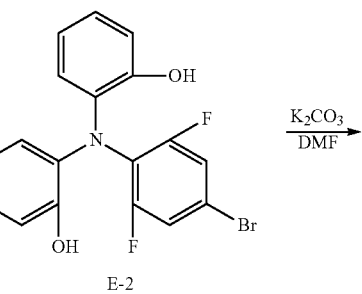

E-2

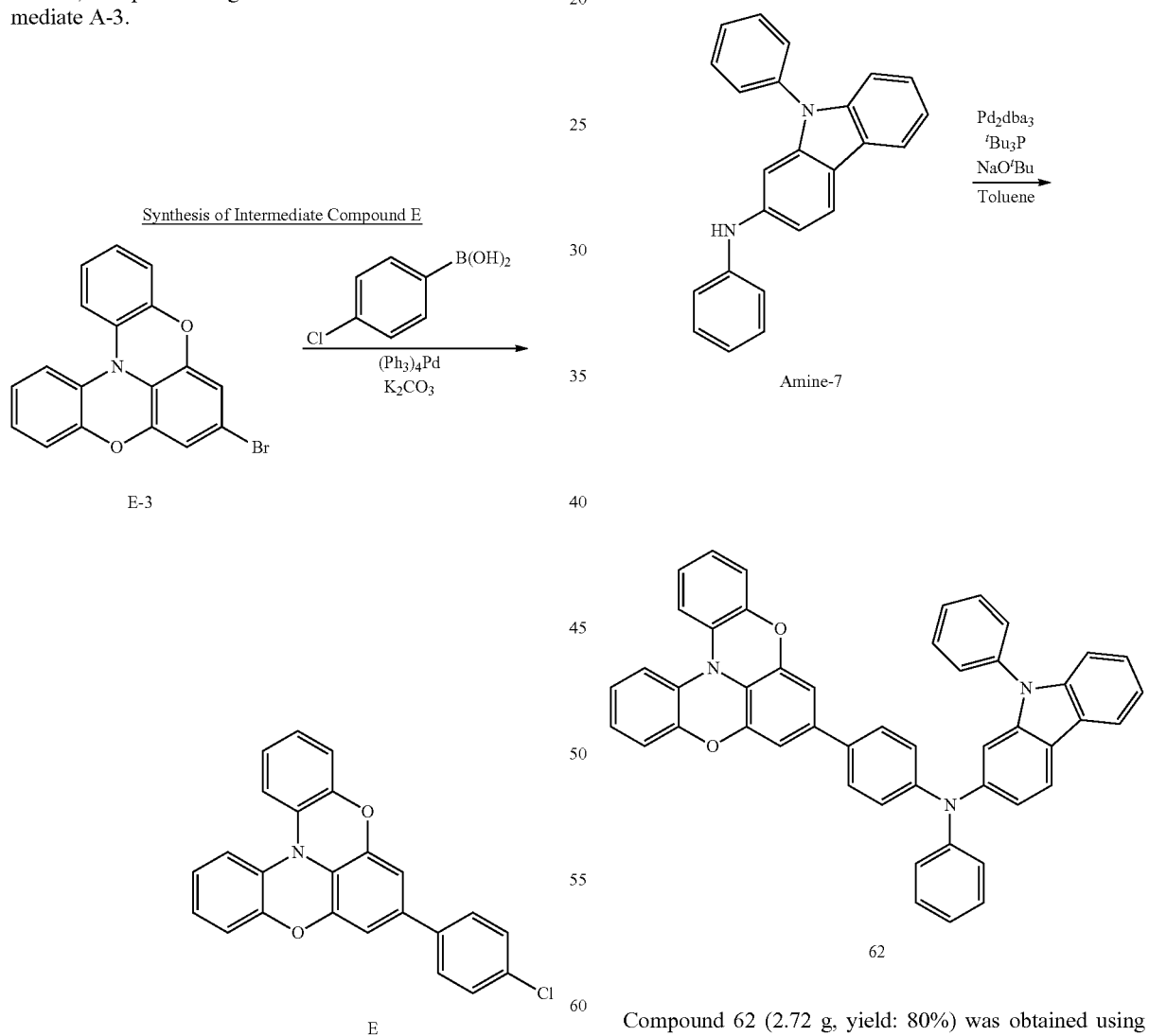

Intermediate E-3 (13.3 g, yield: 80%) was obtained using substantially the same method as the synthesis of Intermediate A, except for using Intermediate E-2 instead of Intermediate A-3.

Synthesis of Intermediate Compound E

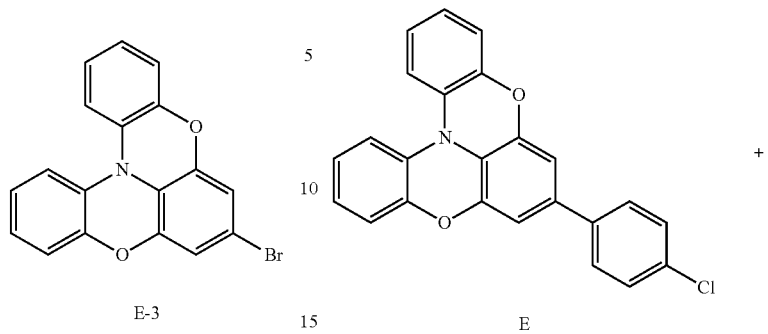

Intermediate E (10.9 g, yield: 75%) was obtained using substantially the same method as the synthesis of Intermediate D, except for using Intermediate E-3 instead of Intermediate B.

Synthesis of Compound 62

Compound 62 (2.72 g, yield: 80%) was obtained using substantially the same method as the synthesis of Compound 1, except for using Intermediate E instead of Intermediate A, and Amine-7 instead of Amine-1.

2. Evaluation of Energy Level of Amine Compound

Compounds used in Examples 1 to 7 and Comparative Examples 1 to 4 are listed in Table 1.

TABLE 1
Compound 1
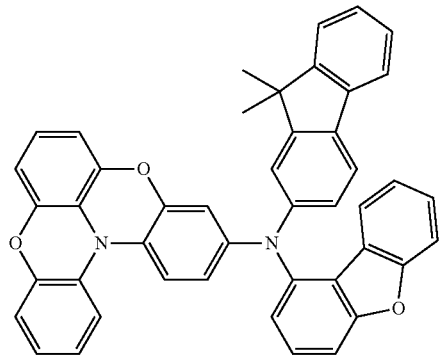
1
HOMO = 5.6 eV
LUMO = 2.5 eV
Compound 2
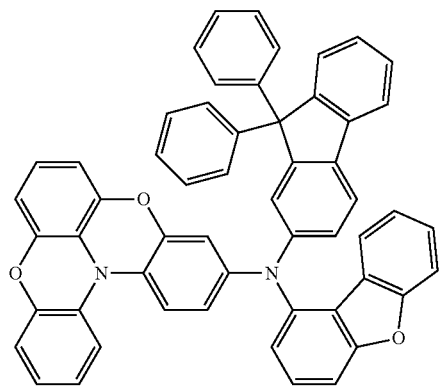
2
HOMO = 5.6 eV
LUMO = 2.5 eV
Compound 4
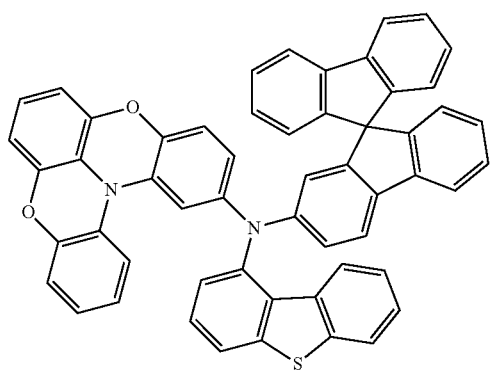
4
HOMO = 5.6 eV
LUMO = 2.5 eV TABLE 1-continued
Compound 8
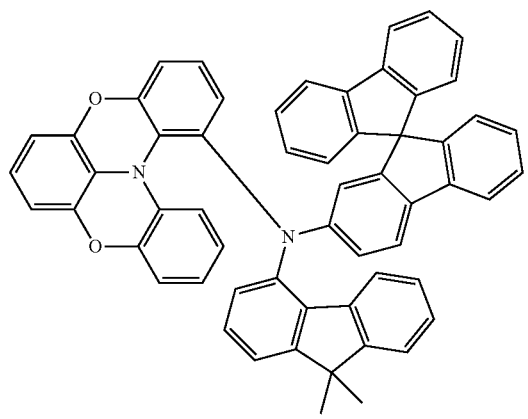
8
HOMO = 5.6 eV
LUMO = 2.5 eV
Compound 23
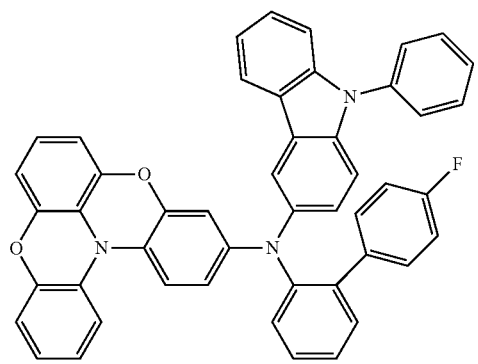
23
HOMO = 5.4 eV
LUMO = 2.2 eV
Compound 32
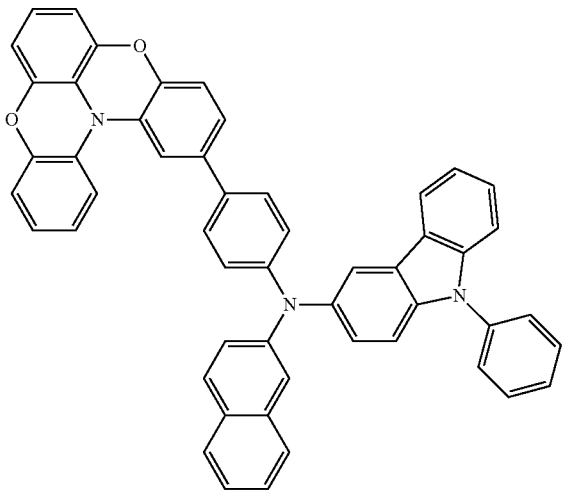
32
HOMO = 5.3 eV
LUMO = 2.1 eV TABLE 1-continued
Compound 62
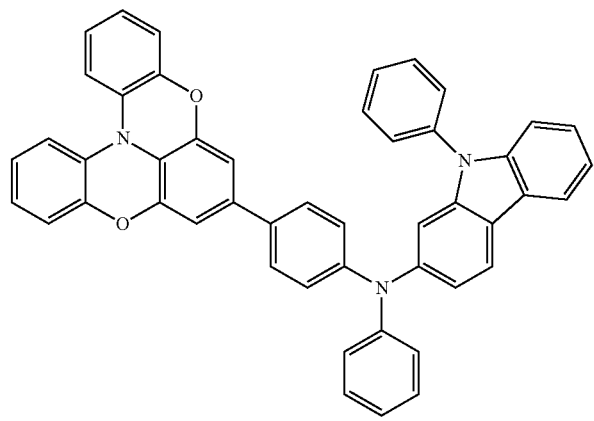
62
HOMO = 5.5 eV
LUMO = 2.2 eV
Comparative Compound C1
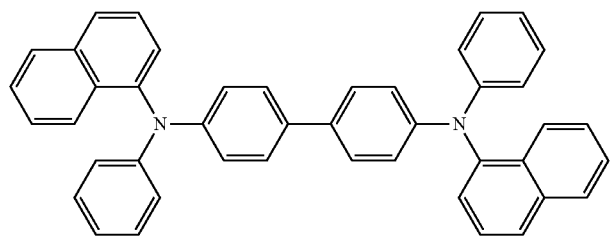
C1
HOMO = 5.5 eV
LUMO = 2.4 eV
Comparative Compound C2
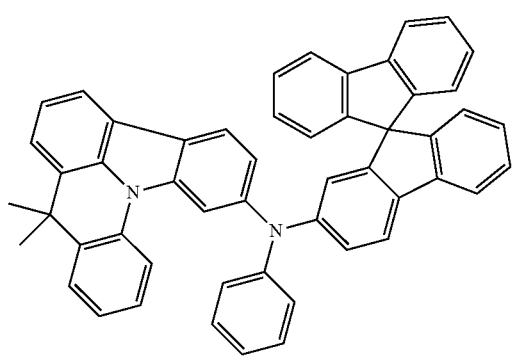
C2
HOMO = 5.6 eV
LUMO = 2.6 eV

TABLE 1-continued

Comparative Compound C3

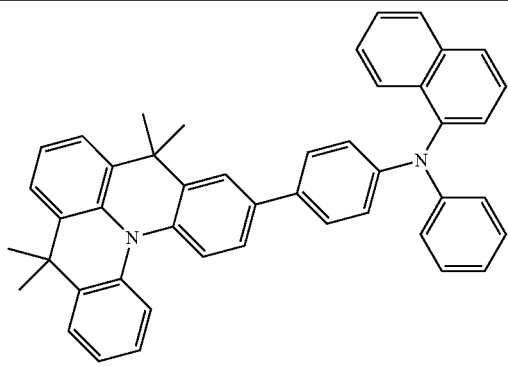

C3
HOMO = 5.7 eV
LUMO = 2.6 eV

Comparative Compound C4

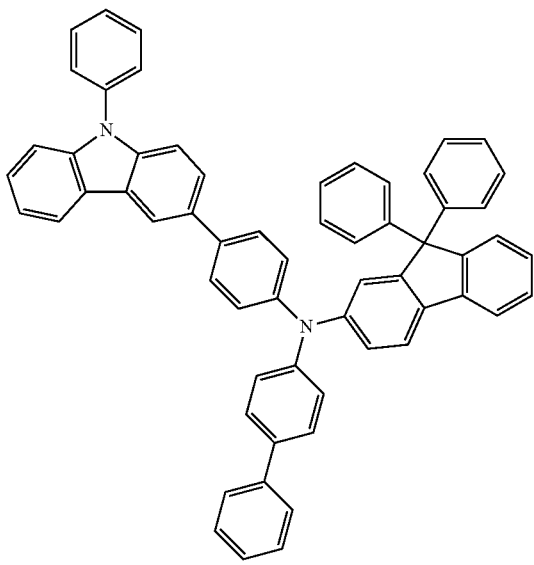

C4
HOMO = 5.5 eV
LUMO = 2.5 eV

3. Manufacture and Evaluation of Organic Electroluminescence Device Including Amine Compound Manufacture of Organic Electroluminescence Device An organic electroluminescence device of an embodiment including the amine compound of an embodiment in a hole transport layer was manufactured as follows. Amine compounds of Compound 1, Compound 2, Compound 4, Compound 8, Compound 23, Compound 32, and Compound 62 which are compounds in embodiments as described herein above were used in a hole transport layer material to manufacture the organic electroluminescence device of embodiments 1 to 7. Comparative Example 1 corresponds to the organic electroluminescence device which is manufactured using Comparative Compound C1 as a hole transport layer material.

An ITO glass substrate having about 15 Ω/cm² (about 1,200 Å) made by Corning Co. was cut to a size of 50 mm×50 mm×0.7 mm, washed with isopropyl alcohol and pure water for about 5 minutes, and cleansed by ultrasonic waves, and then irradiated with ultraviolet rays for about 30 minutes and treated with ozone. Then, (4,4',4"-tris{N-(2-naphthyl)-N-phenylamino}-triphenylamine (2-TNATA) was deposited in vacuum to a thickness of about 600 Å to form a hole injection layer, and the Example Compound or Comparative Compound was deposited in vacuum to a thickness of about 300 Å to form a hole transport layer.

On the hole transport layer, 9,10-di(naphthalen-2-yl)anthracene (DNA) as a blue fluorescence host and 4,4'-bis[2-(4-(N,N-diphenylamino)phenyl)vinyl]biphenyl (DPAVBi) were co-deposited in a ratio of 98:2 to form an emission layer having a thickness of about 300 Å.

On the emission layer, an electron transport layer having a thickness of about 300 Å was formed of tris(8-hydroxyquinolino)aluminum (Alq3). On the electron transport layer, a second electrode having a thickness of about 300 Å was formed of Al.

Compounds used for manufacturing the organic electroluminescence devices of Examples and Comparative Examples are disclosed herein below.

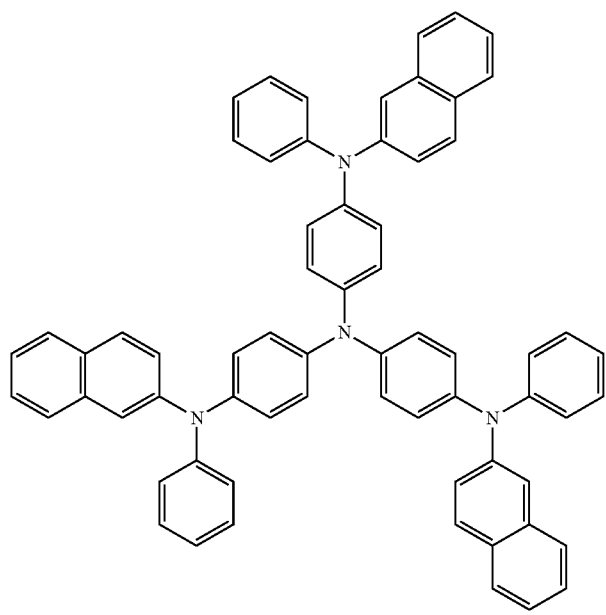

2-TNATA

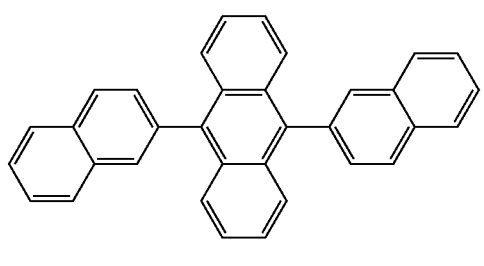

DNA

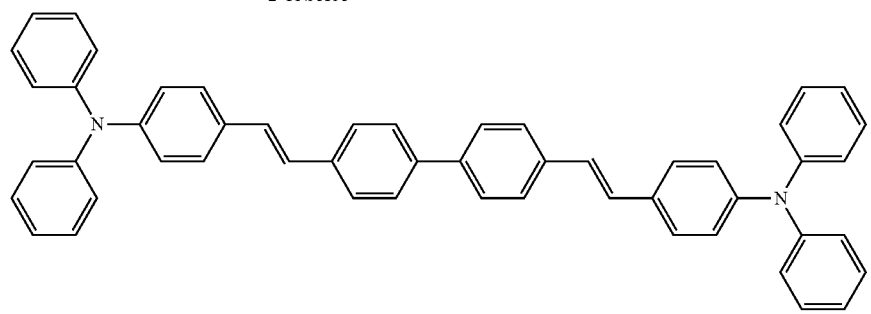

DPAVBi

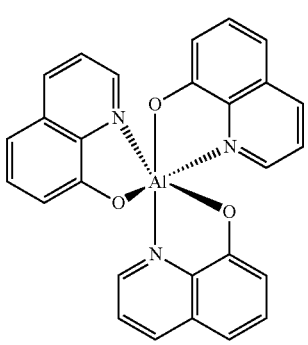

Alq$_3$

Evaluation of Property of Organic Electroluminescence Device

Evaluation results of the organic electroluminescence device of Examples 1 to 7 and Comparative Example 1 are listed in Table 2. Drive voltage, brightness, emitting efficiency, and half-lifespan of the manufactured organic electroluminescence devices are listed as compared in Table 2.

TABLE 2

| Device manufactured examples | Hole transport layer Materials | Drive voltage (V) | Current density (mA/cm$^2$) | Brightness (cd/m$^2$) | Emitting efficiency (cd/A) | Emitting color | Half-lifespan (hr) |
|---|---|---|---|---|---|---|---|
| Example 1 | Compound 1 | 4.32 | 50 | 3670 | 7.34 | Blue | 362 |
| Example 2 | Compound 2 | 4.21 | 50 | 3715 | 7.43 | Blue | 353 |
| Example 3 | Compound 4 | 4.22 | 50 | 3665 | 7.33 | Blue | 372 |
| Example 4 | Compound 8 | 4.26 | 50 | 3730 | 7.46 | Blue | 374 |
| Example 5 | Compound 23 | 4.26 | 50 | 3730 | 7.46 | Blue | 374 |
| Example 6 | Compound 32 | 4.25 | 50 | 3630 | 7.26 | Blue | 384 |
| Example 7 | Compound 62 | 4.41 | 50 | 3725 | 7.45 | Blue | 343 |
| Comparative Example 1 | Comparative Compound C1 | 4.951 | 50 | 3375 | 6.75 | Blue | 258 |
| Comparative Example 2 | Comparative Compound C2 | 5.50 | 50 | 2675 | 5.35 | Blue | 195 |
| Comparative Example 3 | Comparative Compound C3 | 5.40 | 50 | 2645 | 5.29 | Blue | 165 |
| Comparative Example 4 | Comparative Compound C4 | 4.65 | 50 | 3500 | 7.00 | Blue | 300 |

Referring to the results of Table 2, it can be seen that Examples of the organic luminescence devices using the amine compound according to an embodiment of the present disclosure as a hole transport layer material exhibit low drive voltage, relatively high brightness, high emitting efficiency, and long lifespan when compared with Comparative Examples. In the case of Example compounds, an arylamine-based hole transport material includes an aromatic ring substituent forming a condensed ring, and the amine compound of Examples has high stability by the condensed ring including two oxygen atoms and one nitrogen atom. For example, the ability of a hole transport between molecules may be improved by increasing the flatness of the core of the five-ring condensed hetero compound, whereby the organic electroluminescence device of Examples may exhibit more improved emitting efficiency and long lifespan than the organic electroluminescence device of Comparative Examples. The organic electroluminescence device of an embodiment may achieve high emitting efficiency and long lifespan in blue light wavelength region by including the amine compound of an embodiment as a hole transport material.

The organic electroluminescence device according to an embodiment of the present disclosure may exhibit improved device properties such as, for example, high emitting efficiency and long device lifespan.

The amine compound according to an embodiment of the present disclosure may be included in a hole transport region of the organic electroluminescence device to contribute to high efficiency and long lifespan of the organic electroluminescence device.

Although described with reference to example embodiments of the present disclosure, it will be understood that various changes and modifications of the present disclosure may be made by one skilled in the art or one having ordinary knowledge in the art without departing from the spirit and technical field of the present disclosure as defined by the appended claims, and equivalents thereof.

Hence, the technical scope of the present disclosure is not limited to the detailed descriptions in the specification, but it should be determined only by reference of the claims.

What is claimed is:

1. An organic electroluminescence device comprising:
a first electrode;
a second electrode facing the first electrode; and
a plurality of organic layers between the first electrode and the second electrode, wherein:
at least one selected from among the organic layers includes an amine compound,
wherein the amine compound is represented by Formula 1 below:

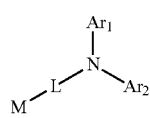

Formula 1 in Formula 1 above,
L is a direct linkage, or a substituted or unsubstituted heteroarylene group having 2 to 30 carbon atoms for forming a ring,
$Ar_1$ and $Ar_2$ are each independently a substituted or unsubstituted aryl group having 6 to 30 carbon atoms for forming a ring, or a substituted or unsubstituted heteroaryl group having 2 to 30 carbon atoms for forming a ring, and
M is represented by Formula 2 below:

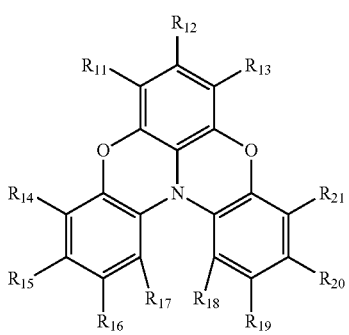

Formula 2 in Formula 2 above,
$R_{11}$ to $R_{21}$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, and
one selected from among $R_{11}$ to $R_{21}$ is a part linked to L of Formula 1.

2. The organic electroluminescence device of claim 1, wherein the organic layers comprise:
a hole transport region on the first electrode;
an emission layer on the hole transport region; and
an electron transport region on the emission layer,
wherein the hole transport region includes the amine compound.

3. The organic electroluminescence device of claim 2, wherein the hole transport region comprises:
a hole injection layer on the first electrode; and
a hole transport layer on the hole injection layer,
wherein the hole transport layer includes the amine compound.

4. The organic electroluminescence device of claim 2, wherein:
the hole transport region comprises a plurality of organic layers, and
the organic layer selected from among the plurality of organic layers which is adjacent to the emission layer includes the amine compound.

5. The organic electroluminescence device of claim 1, wherein the amine compound represented by Formula 1 is represented by Formula 3-1 or Formula 3-2 below:

Formula 3-1

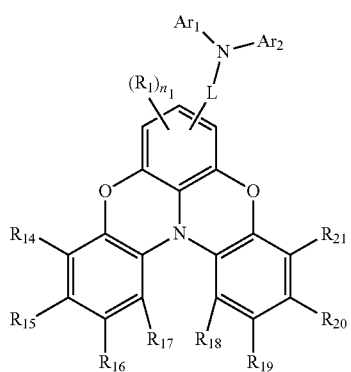

Formula 3-2

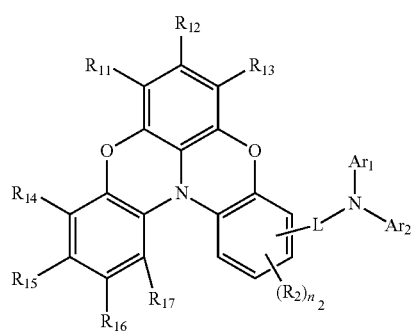

in Formula 3-1 and Formula 3-2 above, $R_1$ and $R_2$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, $n_1$ is an integer of 0 to 2, $n_2$ is an integer of 0 to 3, and $R_{11}$ to $R_{21}$, $Ar_1$, $Ar_2$, and L are the same as defined with respect to Formula 1 and Formula 2.

6. The organic electroluminescence device of claim 1, wherein the amine compound represented by Formula 1 is represented by any one selected from among Formula 4-1 to Formula 4-6 below:

Formula 4-1

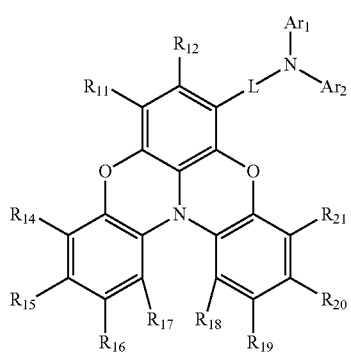

Formula 4-2

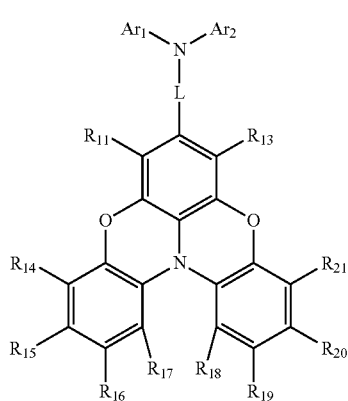

Formula 4-3

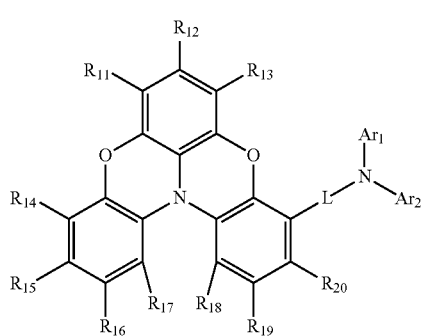

Formula 4-4

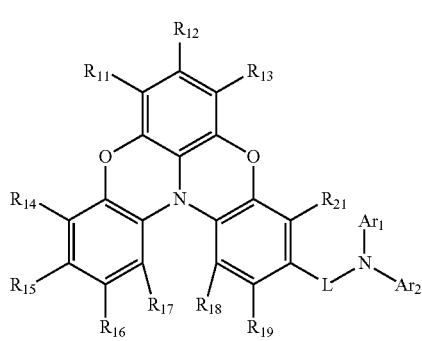

Formula 4-5

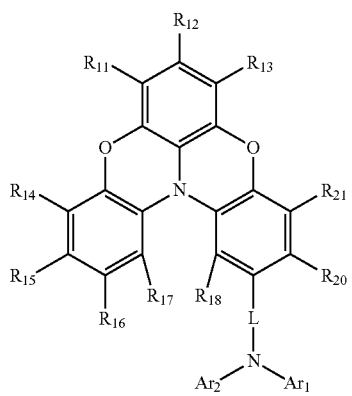

Formula 4-6

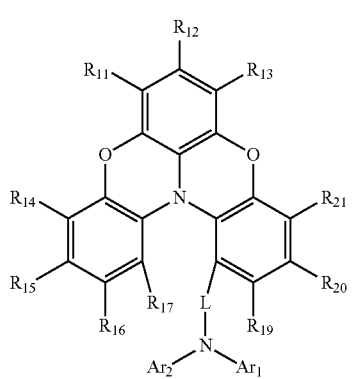

in Formula 4-1 to Formula 4-6 above,

R$_{11}$ to R$_{21}$, Ar$_1$, Ar$_2$, and L are the same as defined with respect to Formula 1 and Formula 2.

7. The organic electroluminescence device of claim 1, wherein the amine compound represented by Formula 1 is represented by Formula 5-1 below:

Formula 5-1

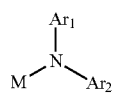

in Formula 5-1 above,

Ar$_1$, Ar$_2$, and M are the same as defined with respect to Formula 1.

8. The organic electroluminescence device of claim 1, wherein Ar$_1$ and Ar$_2$ are each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, a substituted or unsubstituted dibenzofuran group, or a substituted or unsubstituted dibenzothiophene group.

9. The organic electroluminescence device of claim 1, wherein Ar$_1$ and Ar$_2$ are different from each other.

10. The organic electroluminescence device of claim 1, wherein the amine compound is at least one selected from among compounds represented in Compound Group 1 below:

Compound Group 1

1

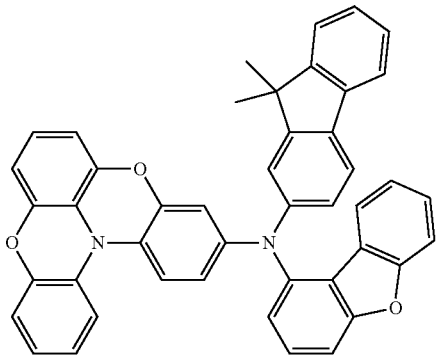

2

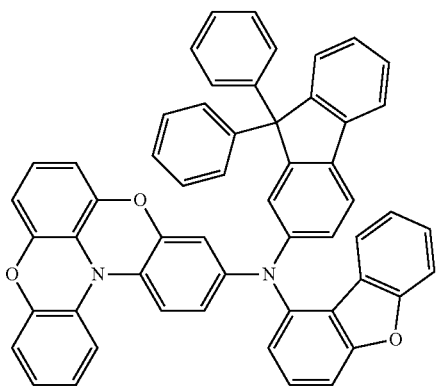

3

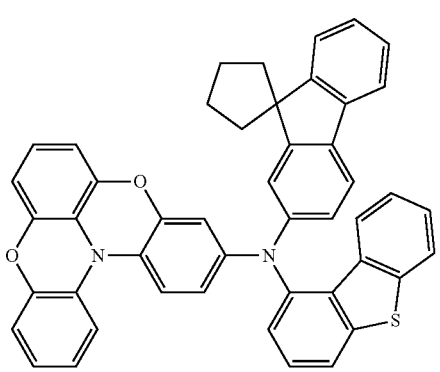

4

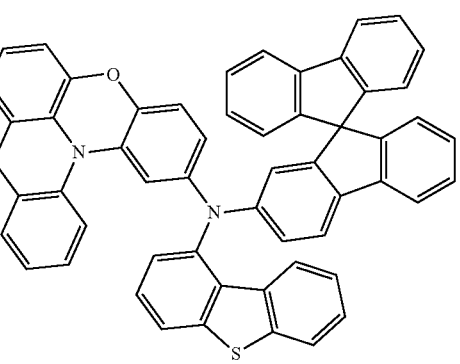

5
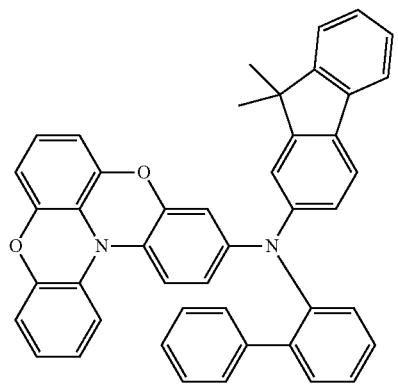
6
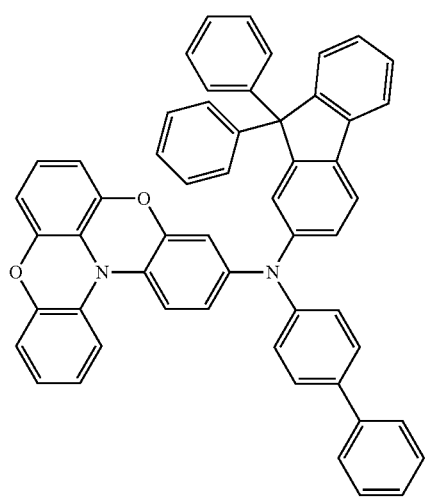
7
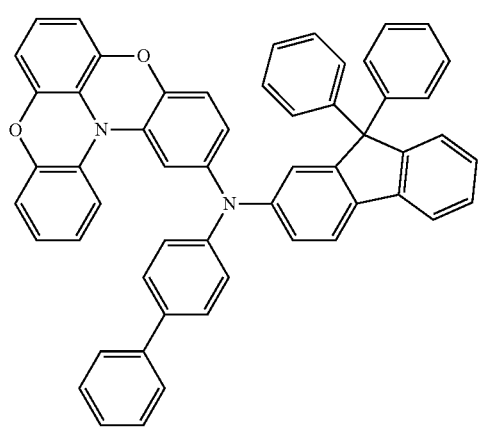
8
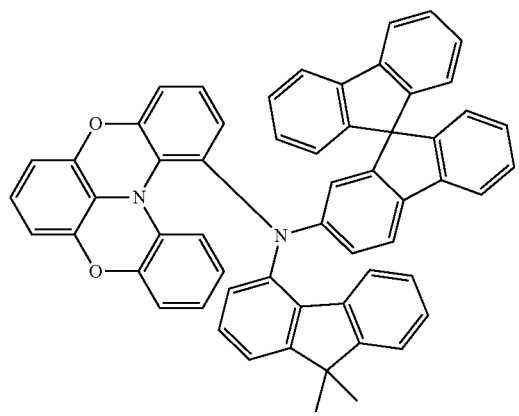
17
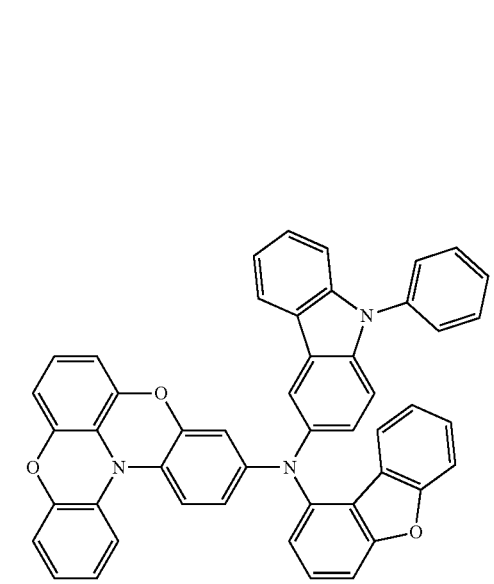
18
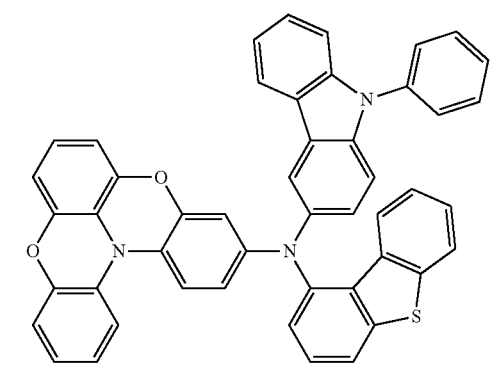

19
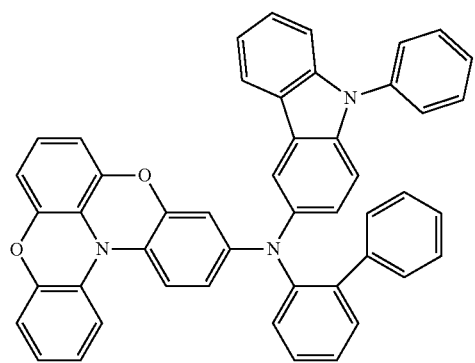
20
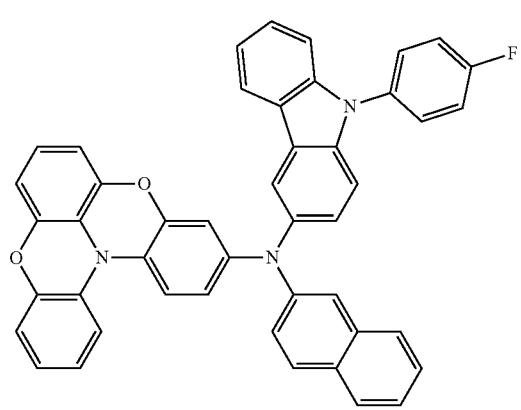
21
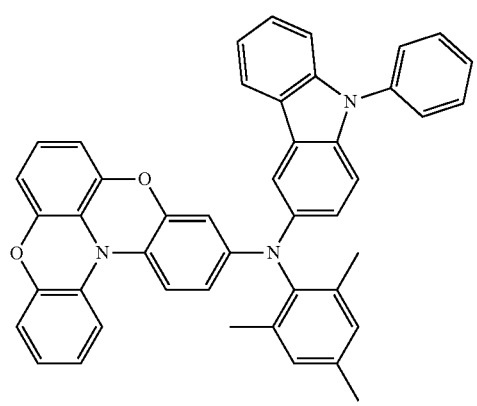
22
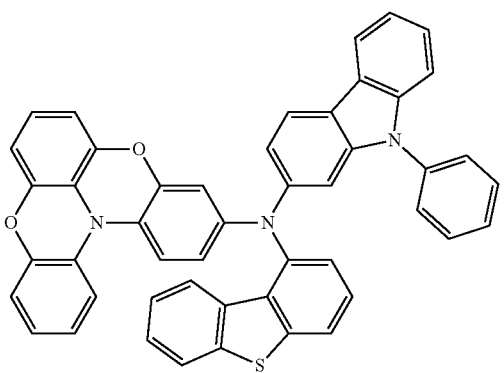
23
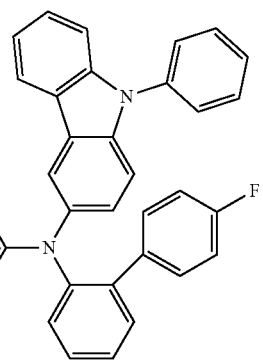
24
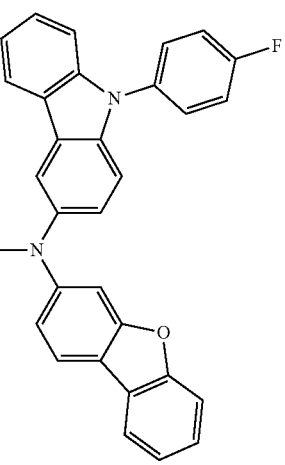
33
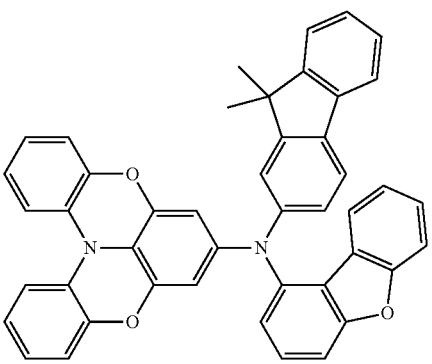

34
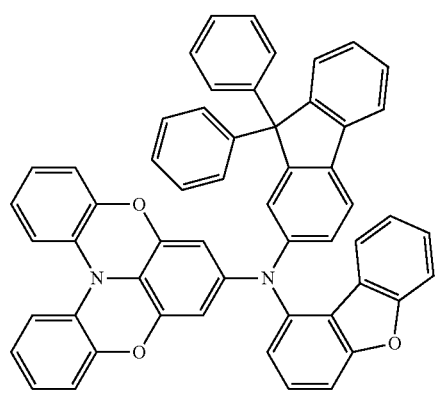
35
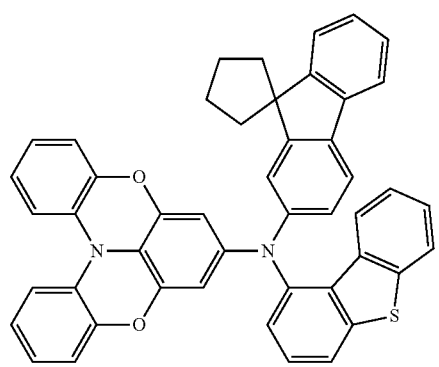
36
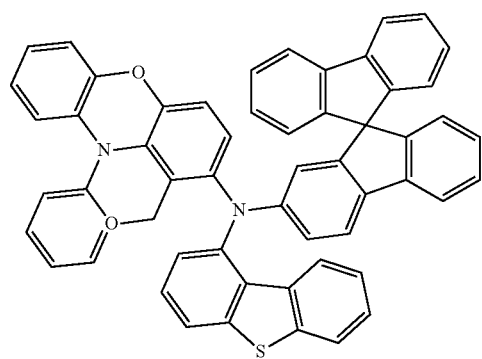
37
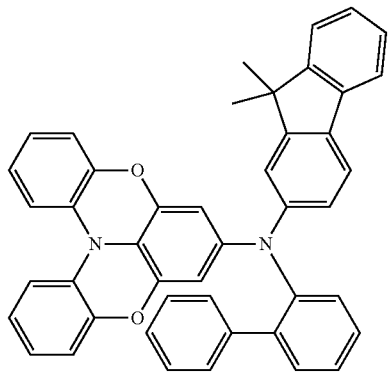
38
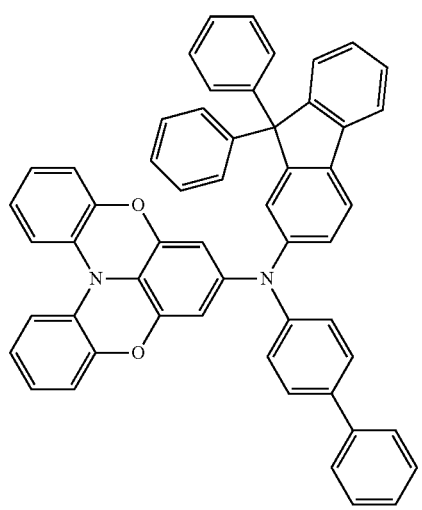
39
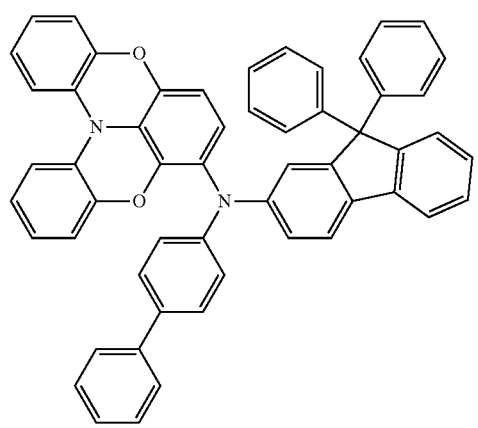

40
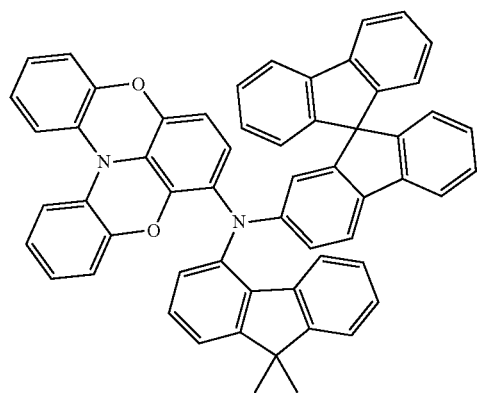
49
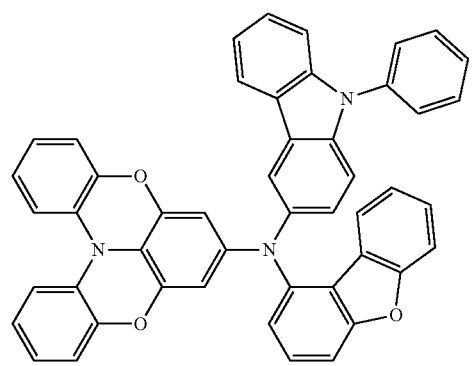
50
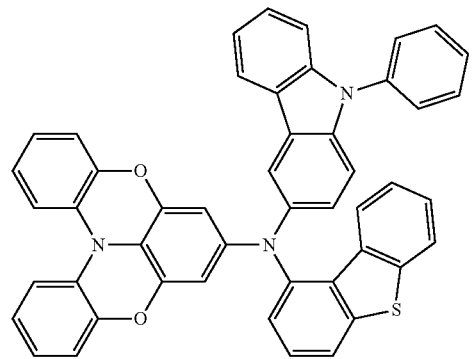
51
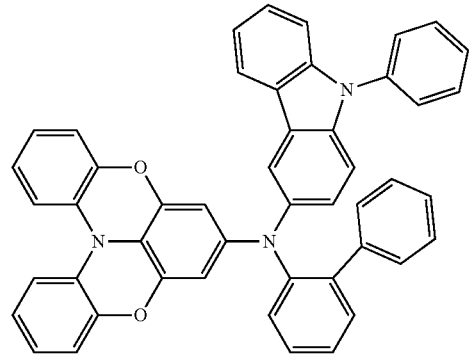
52
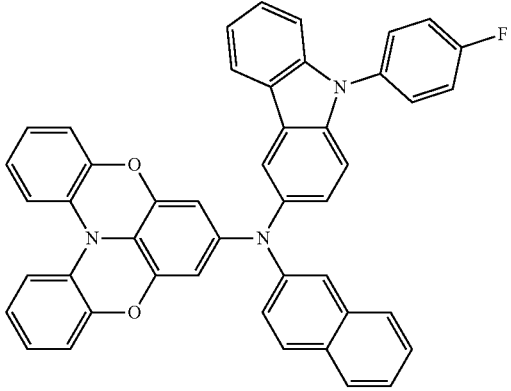
53
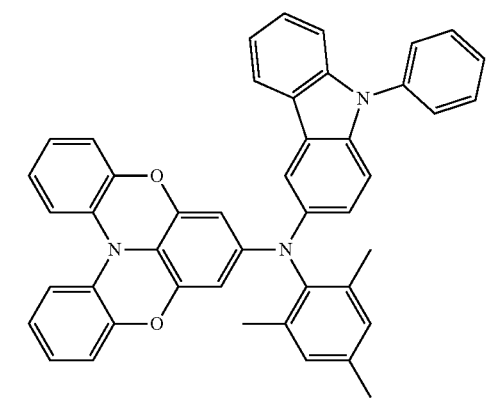
54
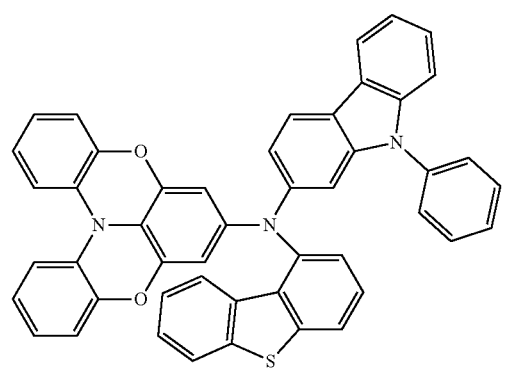
55
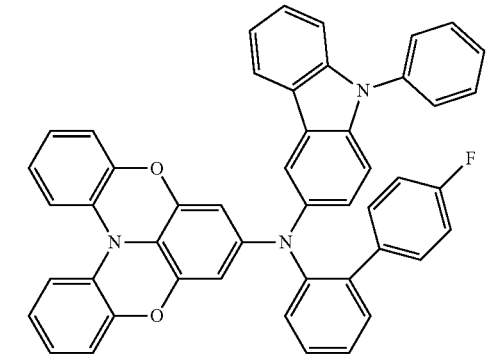

-continued

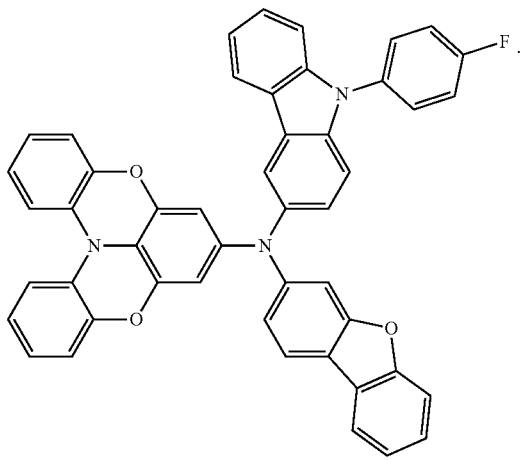

56

11. An organic electroluminescence device comprising:
a first electrode;
a second electrode facing the first electrode; and
a plurality of organic layers between the first electrode and the second electrode,
wherein at least one organic layer selected from among the organic layers comprises an amine compound represented by Formula 1 below:

Formula 1 in Formula 1 above,
L is a direct linkage or a substituted or unsubstituted heteroarylene group having 2 to 30 carbon atoms for forming a ring,
$Ar_1$ and $Ar_2$ are each independently a substituted or unsubstituted aryl group having 6 to 30 carbon atoms for forming a ring, or a substituted or unsubstituted heteroaryl group having 2 to 30 carbon atoms for forming a ring, and
M is represented by Formula 2 below:

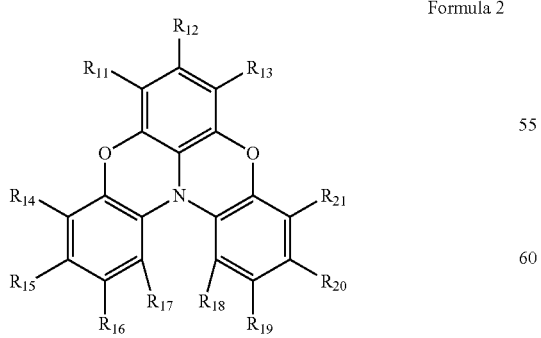

Formula 2 in Formula 2,
$R_{11}$ to $R_{21}$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, and
one selected from among $R_{11}$ to $R_{21}$ is a part linked to L of Formula 1.

12. An amine compound represented by Formula 1 below:

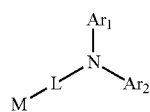

Formula 1 in Formula 1,
L is a direct linkage or a substituted or unsubstituted heteroarylene group having 2 to 30 carbon atoms for forming a ring,
$Ar_1$ and $Ar_2$ are each independently a substituted or unsubstituted aryl group having 6 to 30 carbon atoms for forming a ring, or a substituted or unsubstituted heteroaryl group having 2 to 30 carbon atoms for forming a ring, and
M is represented by Formula 2 below:

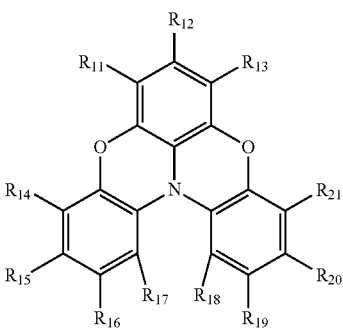

Formula 2 in Formula 2 above,
$R_{11}$ to $R_{21}$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, and
one selected from among $R_{11}$ to $R_{21}$ is a part linked to L to Formula 1.

13. The amine compound of claim 12, wherein the amine compound represented by Formula 1 is represented by Formula 3-1 or Formula 3-2 below:

Formula 3-1

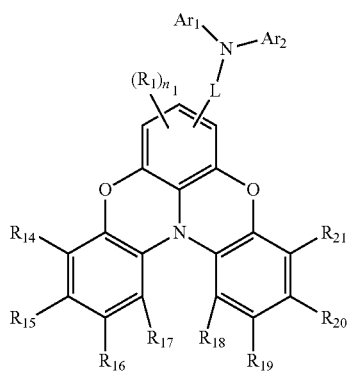

Formula 3-2

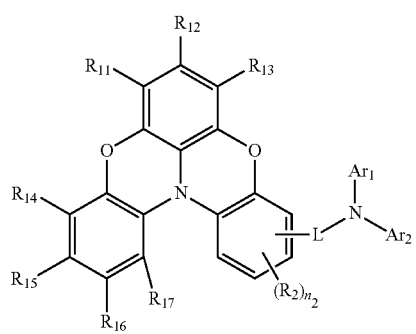

in Formula 3-1 and Formula 3-2 above, $R_1$ and $R_2$ are each independently a hydrogen atom, a deuterium atom, a halogen atom, a substituted or unsubstituted alkyl group having 1 to 20 carbon atoms, a substituted or unsubstituted aryl group having 6 to 60 carbon atoms for forming a ring, or a substituted or unsubstituted heteroaryl group having 2 to 60 carbon atoms for forming a ring, $n_1$ is an integer of 0 to 2, $n_2$ is an integer of 0 to 3, and $R_{11}$ to $R_{21}$, $Ar_1$, $Ar_2$, and L are the same as defined with respect to Formula 1 and Formula 2.

14. The amine compound of claim 12, wherein the amine compound represented by Formula 1 is represented by any one selected from among Formula 4-1 to Formula 4-6 below:

Formula 4-1

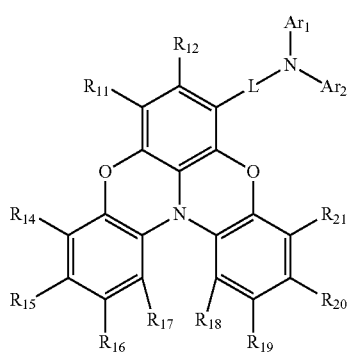

Formula 4-2

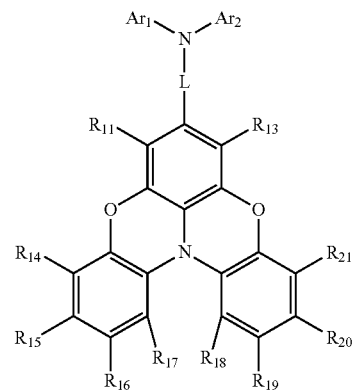

Formula 4-3

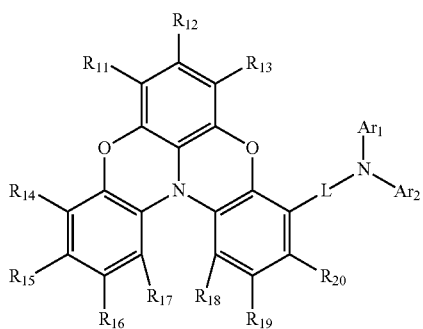

Formula 4-4

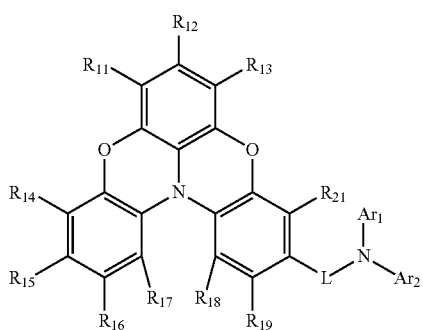

Formula 4-5

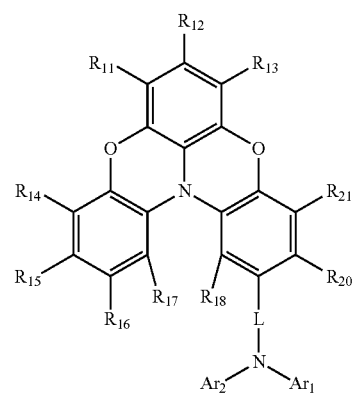

Formula 4-6

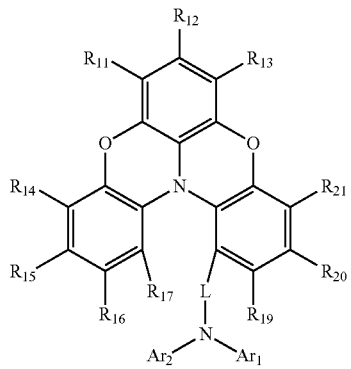

in Formula 4-1 to Formula 4-6, $R_{11}$ to $R_{21}$, $Ar_1$, $Ar_2$, and L are the same as defined with respect to Formula 1 and Formula 2.

15. The amine compound of claim 12, wherein the amine compound represented by Formula 1 is represented by Formula 5 below:

Formula 5-1

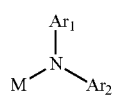

in Formula 5 above, $Ar_1$, $Ar_2$, and M are the same as defined with respect to Formula 1.

16. The amine compound of claim 12, wherein $Ar_1$ and $Ar_2$ are each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, a substituted or unsubstituted dibenzofuran group, or a substituted or unsubstituted dibenzothiophene group.

17. The amine compound of claim 12, wherein $Ar_1$ and $Ar_2$ are different from each other.

18. The amine compound of claim 12, wherein the amine compound is at least one selected from among compounds represented in Compound Group 1 below:

Compound Group 1

1

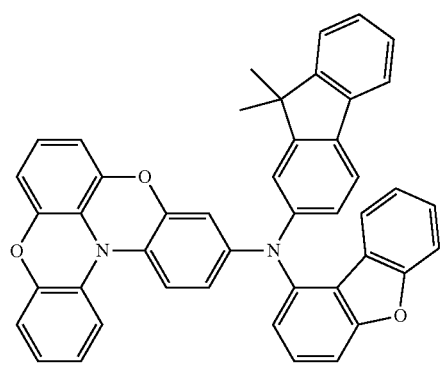

2

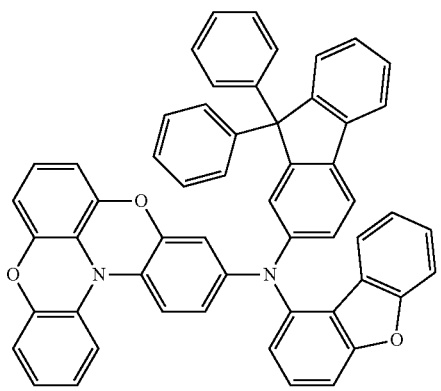

3

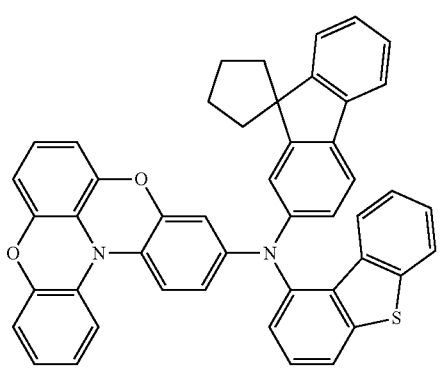

4

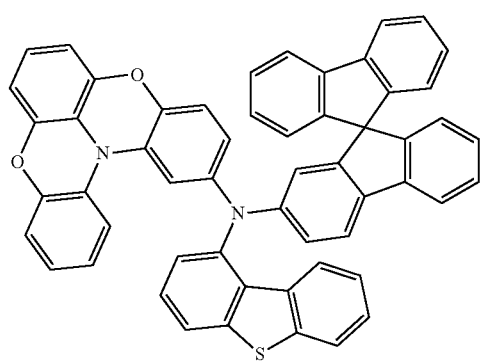

5

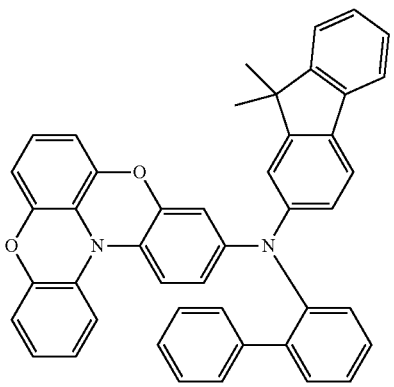

89
6
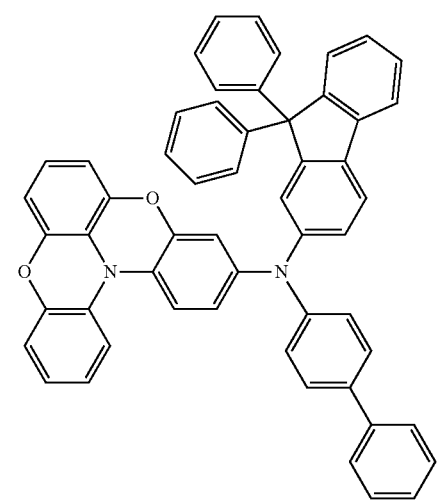
7
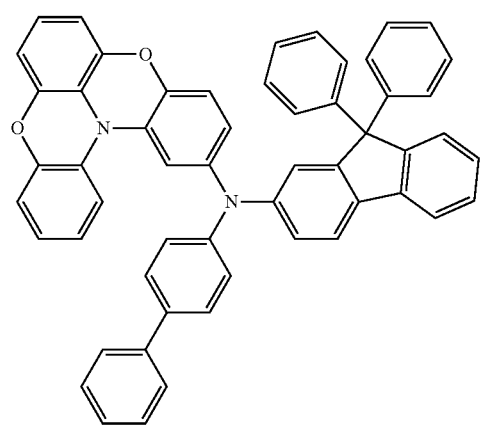
8
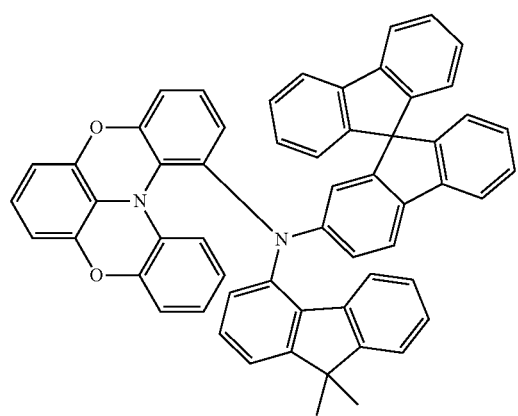
90
17
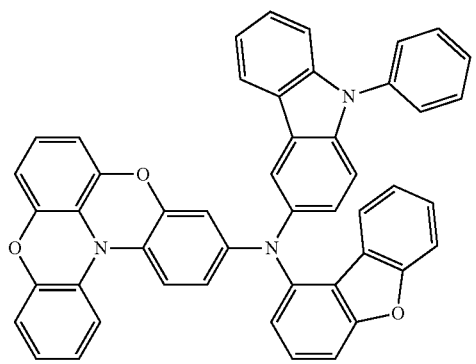
18
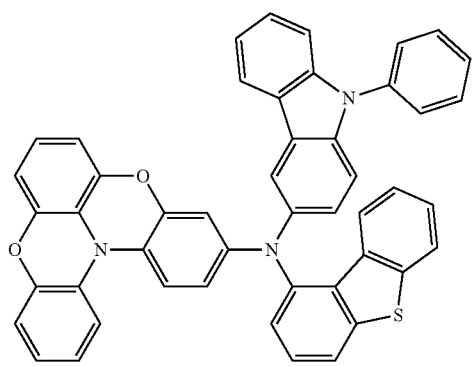
19
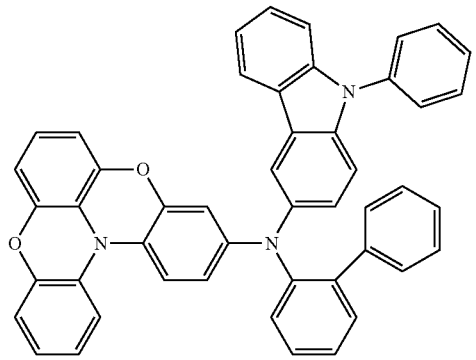
20
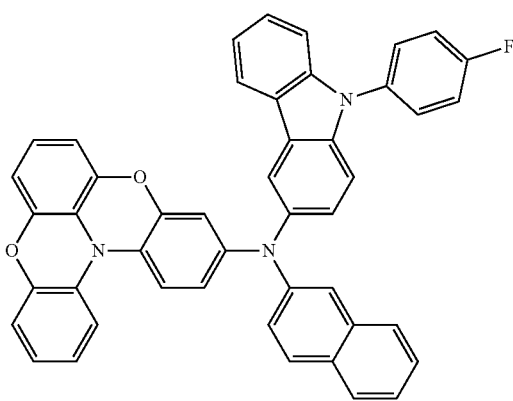

21
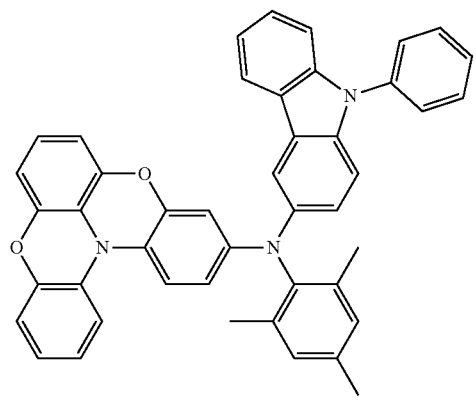
22
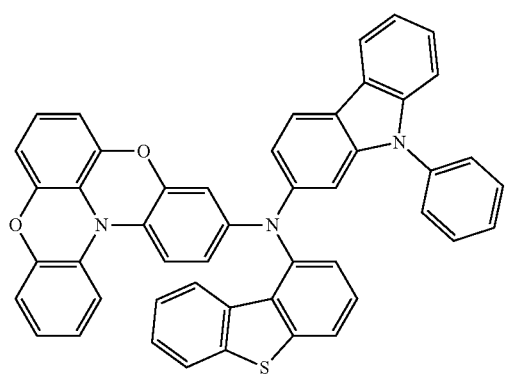
23
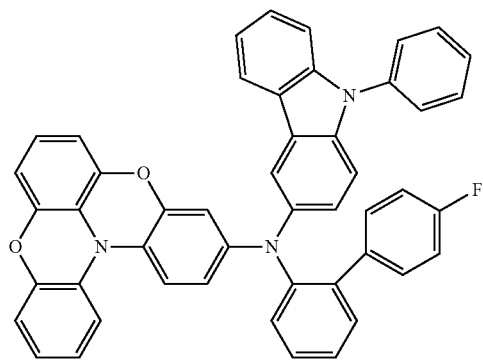
24
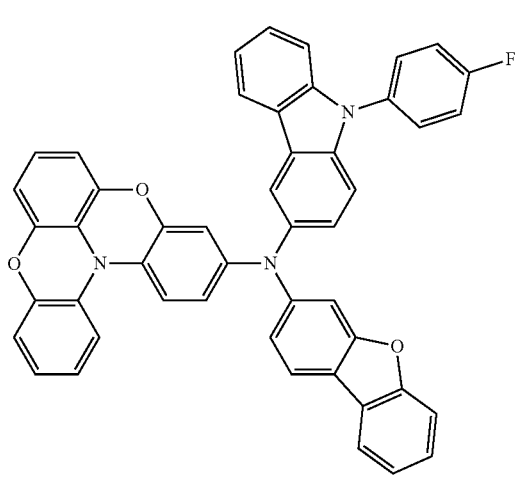
33
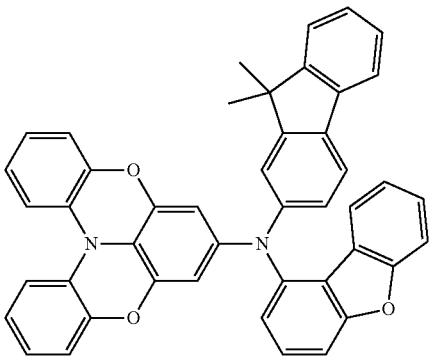
34
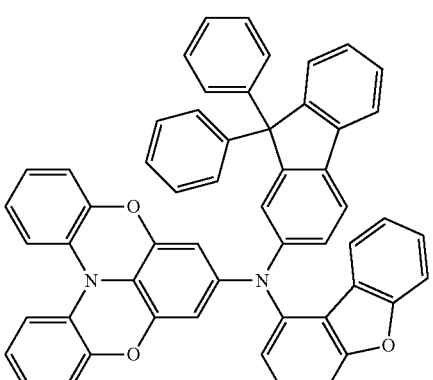
35
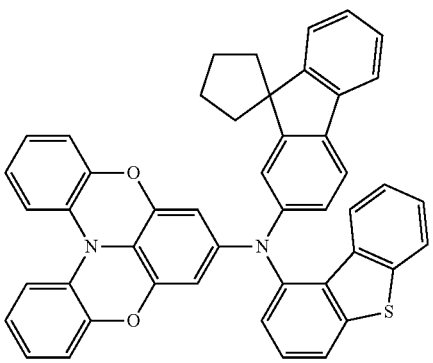
36
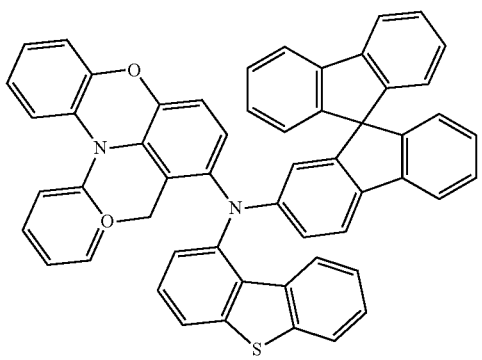

37
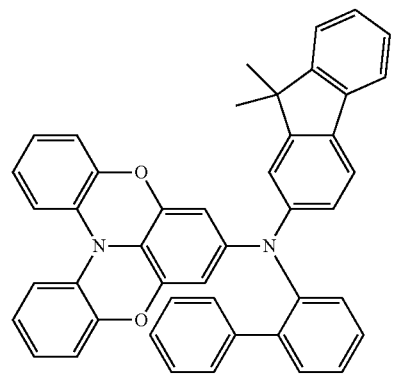
40
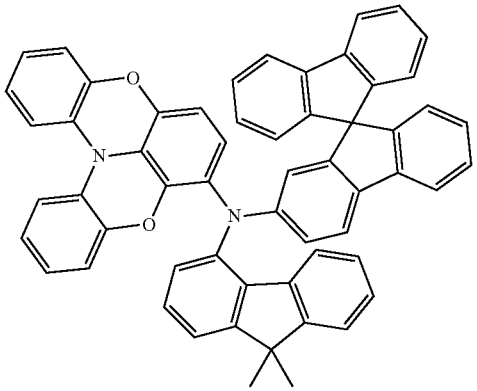
38
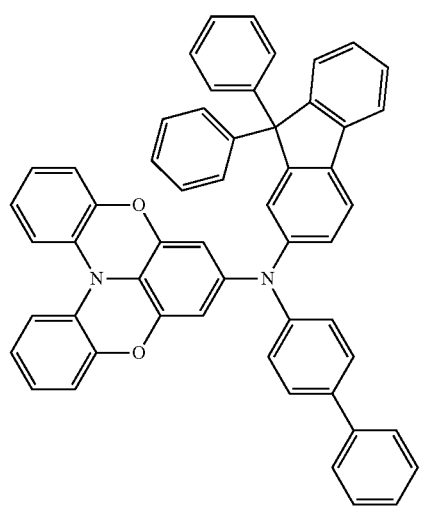
49
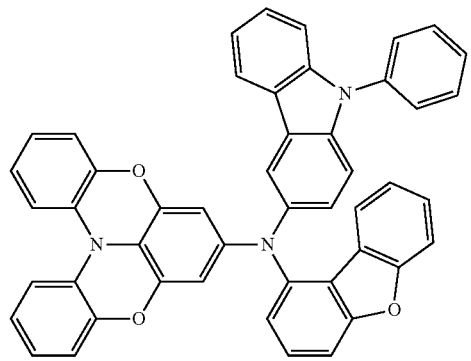
39
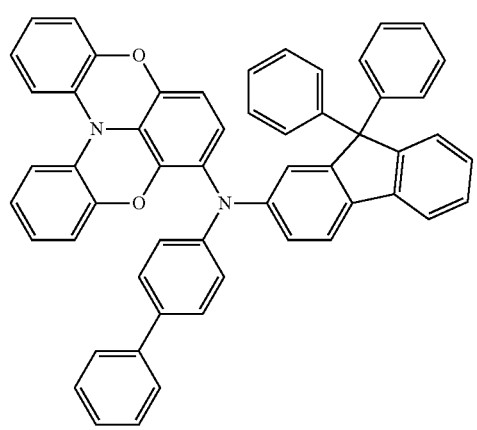
50
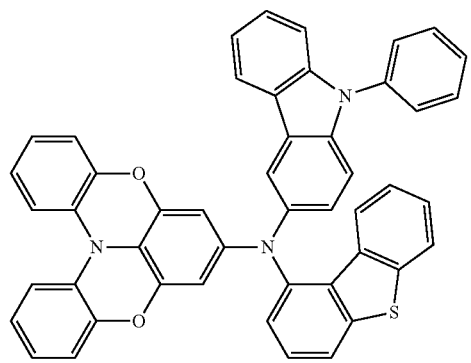

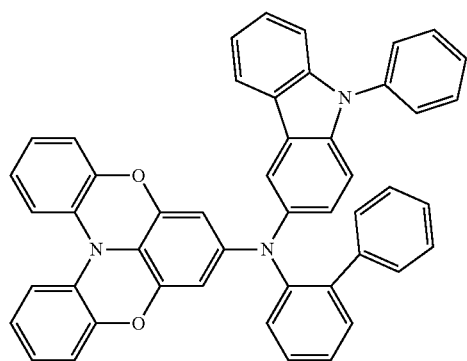
51
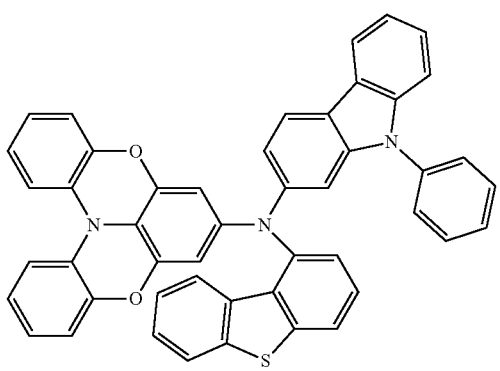
54
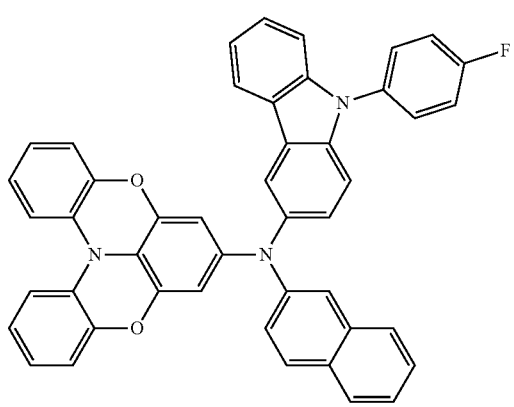
52
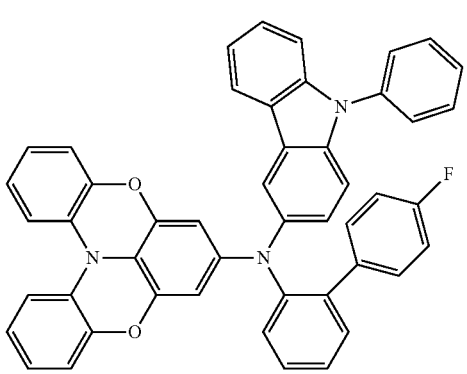
55
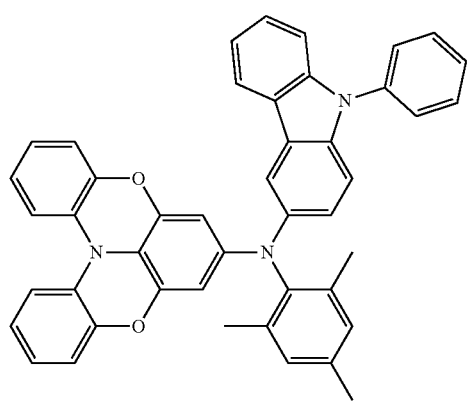
53
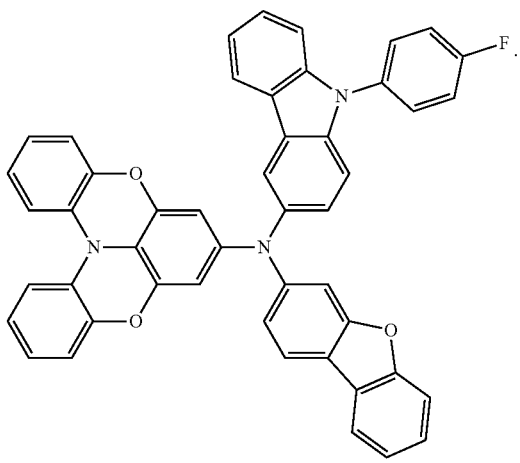
56
* * * * *

UNITED STATES PATENT AND TRADEMARK OFFICE
CERTIFICATE OF CORRECTION

| | | |
|---|---|---|
| PATENT NO. | : 11,770,973 B2 | |
| APPLICATION NO. | : 16/858392 | |
| DATED | : September 26, 2023 | |
| INVENTOR(S) | : Sanghyun Han et al. | |

It is certified that error appears in the above-identified patent and that said Letters Patent is hereby corrected as shown below:

In the Claims

In Column 83, Line 40, in Claim 11, delete "linkage" and insert -- linkage, --.
In Column 84, Line 23, in Claim 12, delete "linkage" and insert -- linkage, --.
In Column 87, Line 23, in Claim 15, delete "5" and insert -- 5-1 --.
In Column 87, Line 33, in Claim 15, delete "5" and insert -- 5-1 --.

Signed and Sealed this
Twenty-third Day of April, 2024

*Katherine Kelly Vidal*

Katherine Kelly Vidal
*Director of the United States Patent and Trademark Office*